(12) United States Patent
Oki

(10) Patent No.: US 8,295,020 B2
(45) Date of Patent: Oct. 23, 2012

(54) ELECTRONIC CIRCUIT

(75) Inventor: Hirokazu Oki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 863 days.

(21) Appl. No.: 12/441,164

(22) PCT Filed: Nov. 21, 2007

(86) PCT No.: PCT/JP2007/072522
§ 371 (c)(1), (2), (4) Date: Mar. 13, 2009

(87) PCT Pub. No.: WO2008/065941
PCT Pub. Date: Jun. 5, 2008

(65) Prior Publication Data
US 2010/0085675 A1    Apr. 8, 2010

(30) Foreign Application Priority Data

Nov. 30, 2006  (JP) .................... 2006-323217
Nov. 30, 2006  (JP) .................... 2006-323235
Nov. 30, 2006  (JP) .................... 2006-323250
Nov. 30, 2006  (JP) .................... 2006-323255

(51) Int. Cl.
*H02H 9/02* (2006.01)
*H02H 7/122* (2006.01)
(52) U.S. Cl. ....... 361/87; 361/93.1; 361/101; 363/56.04
(58) Field of Classification Search .......... 361/101, 361/87, 93.1; 363/56.04
See application file for complete search history.

(56) References Cited

U.S. PATENT DOCUMENTS

| | | | | |
|---|---|---|---|---|
| 3,912,205 A | * | 10/1975 | Koyama | 242/333.2 |
| 4,479,097 A | * | 10/1984 | Larson et al. | 331/111 |
| 4,720,758 A | * | 1/1988 | Winslow | 361/93.7 |
| 5,614,872 A | * | 3/1997 | Tagiri | 331/143 |
| 5,657,361 A | * | 8/1997 | Inagaki et al. | 377/39 |
| 7,221,129 B2 | | 5/2007 | Matsuo et al. | |
| 7,561,450 B2 | * | 7/2009 | Adragna et al. | 363/56.03 |

(Continued)

FOREIGN PATENT DOCUMENTS

JP   58-064517   4/1983

(Continued)

OTHER PUBLICATIONS

UC1842 Current Mode PWM Controller, Apr. 1997, Texas Instruments, Inc., pp. 1-7.*

*Primary Examiner* — Rexford Barnie
*Assistant Examiner* — Zeev V Kitov
(74) *Attorney, Agent, or Firm* — Fish & Richardson P.C.

(57) ABSTRACT

Provided is an electronic circuit including an upper control unit and a lower control unit. The upper control unit performs a logic transition of a gate signal so as to off-latch an upper switch by using the fall edge of a drive signal as a trigger and release the off-latch of the upper switch by using the rise edge of a monitor signal as a trigger. The lower control unit performs a logic transition of the gate signal so as to off-latch a lower switch by using the rise edge of the drive signal as a trigger and release the off-latch of the lower switch by using the rise edge of a monitor signal as a trigger.

15 Claims, 10 Drawing Sheets

U.S. PATENT DOCUMENTS

2005/0258811 A1  11/2005  Matsuo et al.

FOREIGN PATENT DOCUMENTS

| JP | 59-047971 | 3/1984 |
| JP | 59-113774 | 6/1984 |
| JP | 63-274363 | 11/1988 |
| JP | 04-334114 | 11/1992 |
| JP | 06-038520 | 2/1994 |
| JP | 10-136644 | 5/1998 |
| JP | 2005-080407 | 3/2005 |
| JP | 2005-253201 | 9/2005 |
| JP | 2005-341789 | 12/2005 |

* cited by examiner

ELECTRONIC CIRCUIT

TECHNICAL FIELD

The present invention relates to an electronic circuit provided with a switch driver circuit for driving a pair of switches that are connected in series between two different potentials, and particularly relates to a technology for preventing the pair of switches from being simultaneously turned on.

BACKGROUND ART

Many of switching regulators, charge pumps, driver ICs and the like conventionally have, as an output stage, a pair of switch devices that are connected in series between two different potentials.

In driving such pair of switch devices, it is important to prevent them from being simultaneously turned on in order to prevent a flow-through current from destroying devices and reducing efficiency.

FIG. 6 is a circuit block diagram showing a conventional example of a switch driver circuit.

As shown in FIG. 6, the switch driver circuit of this conventional example includes: switch devices N1 and N2; comparators CMP1 and CMP2 for monitoring a gate signal "a1" of the switch device N1 and a gate signal "a2" of the switch device N2, respectively; an AND operator AND1 for performing an AND operation between a monitor signal "b1" of the comparator CMP1 and a drive signal CLK; and an AND operator AND2 for performing an AND operation between a monitor signal "b2" of the comparator CMP2 and the drive signal CLK, and generates a simultaneous OFF-period "d" of the switch devices (see FIG. 7), during which both of them are turned off, by controlling the gate signal of each one of the pair of switch devices according to a monitor result of monitoring the gate signal of the other one of the pair of switch devices.

More specifically, the gate signal "a1" is shifted from low level (L) to high level (H) when both the drive signal CLK and the monitor signal "b2" are high level (H). That is, the switch device N1 is turned on after the switch device N2 is turned off. On the other hand, the gate signal "a2" is shifted from low level (L) to high level (H) when the drive signal CLK is low level (L) and the monitor signal "b1" is high level (H). That is, the switch device N2 is turned on after the switch device N1 is turned off.

As an example of the conventional technology related to the above description, Patent Document 1 listed below discloses and proposes a switching power supply comprising: first and second transistors; driving means for alternately allowing the first and second transistors to conduct; a transformer whose primary winding forms part of current paths through the first and second transistors, wherein the driving means is formed of: means for generating a rectangular waveform signal; detecting means for detecting that a current flowing through one of the first and second transistors is flowing through the primary winding, and for generating a detection signal while the current is being detected; and means for alternately generating, by combining the rectangular waveform signal and the detection signal, first and second drive signals that are shorter than a half cycle of the rectangular waveform signal by storage times of the first and second transistors, respectively, and the first and second drive signals are base drive signals of the first and second transistors, respectively.

Also, many electronic circuits such as a switching regulator, a charge pump, and a driver IC conventionally incorporate a timer latch type protection circuit as protection means that performs a predetermined protection operation when a circuit abnormality is detected.

As an example of the technology related to the above description, Patent Documents 2 and 3 listed below each disclose and propose a switching power supply circuit that achieves a load short-circuit protection function by using a timer latch type protection circuit that monitors an output voltage.

Also, conventionally, electronic circuits such as a switching regulator, a charge pump, and a driver IC are often provided with an overcurrent protection function of performing a predetermined protection operation when generation of an overcurrent is detected.

As an example of the technology related to the above description, Patent Document 4 listed below discloses and proposes an overcurrent protection circuit of a self-oscillation type direct current-direct current converter that exploits blocking oscillation, wherein the overcurrent protection circuit is provided with: an output voltage reduction detection circuit for detecting reduction of an output voltage when an abnormality such as an overload and a short circuit has occurred and stopping oscillation of a switching device when the output voltage is at a predetermined level or lower; and a start-up detection operation stopping circuit for stopping operation of the output voltage reduction detection circuit only at a start-up time when power is turned on.

Also, oscillation circuits that generate a signal such as a triangular waveform signal and a pulse signal have conventionally been used in various electronic circuits such as a switching regulator, a charge pump, and a driver IC.

In particular, for the purpose of giving the user a higher degree of freedom in setting, many electronic circuits provided with an oscillation circuit are configured such that the oscillation frequency can be adjusted as necessary via an external device (such as a resistor and a capacitor) (see, for example, Patent Document 5 listed below).

Patent Document 1: JP-A-S59-113774
Patent Document 2: JP-A-S63-274363
Patent Document 3: JP-A-H10-136644
Patent Document 4: JP-A-H06-38520
Patent Document 5: JP-A-H04-334114

DISCLOSURE OF THE INVENTION

Problems to be Solved by the Invention

It is true that the switch devices N1 and N2 of the switch driver circuit shown in FIG. 6 can logically be prevented from being simultaneously turned on.

However, in the conventional switch driver circuit, no consideration is given to an inevitable signal delay occurring in a circuit, and as a result, the switch devices N1 and N2 may be simultaneously turned on under some driving conditions of the drive signal CLK.

FIG. 7 is a timing chart for illustrating a conventional example of switching driving.

As shown in (b) of the figure, in the case where the duty of the drive signal CLK has a medium value, a simultaneous ON-state prevention function of the switch driver circuit normally functions regardless of a signal delay in a circuit.

On the other hand, in the case where the duty of the drive signal CLK has a smaller value and thus the high-level period thereof is shorter as shown in (a) of the figure, the drive signal CLK falls to low level (L) immediately after the gate signal "a1" rises to high level (H), which causes the gate signal "a1" to fall to low level (L) again. Here, a predetermined delay occurs in a time period between a rising edge of the gate signal "a1" and a falling edge of the monitor signal "b1" and in a time period between a falling edge of the drive signal CLK and a falling edge of the gate signal "a1". As a result, in a high-level period of the gate signal "a1" (that is, an ON-period of the switch device N1), a period appears during which the drive signal CLK is low level (L) and the monitor signal "b1" is high level (H), and this may invite an unintended shift of the gate signal "a2" to high level (H), causing the switch devices N1 and N2 to be simultaneously turned on.

Likewise, in the case where the duty of the drive signal CLK has a larger value and thus the low-level period thereof is short as shown in (c) of the figure, the drive signal CLK rises to high level (H) immediately after the gate signal "a2" rises to high level (H), which causes the gate signal "a2" to fall to low level (L) again. Here, a predetermined delay occurs in a time period between a rising edge of the gate signal "a2" and a falling edge of the monitor signal "b2" and in a time period between a rising edge of the drive signal CLK and a falling edge of the gate signal "a2". As a result, in a high-level period of the gate signal "a2" (that is, an ON-period of the switch N2), a period appears during which the drive signal CLK is high level (H) and the monitor signal "b2" is also high level (H), and this may invite an unintended shift of the gate signal "a1" to high level (H), causing the switch devices N1 and N2 to be simultaneously turned on.

In particular, since switching frequencies of switch devices N1 and N2 tend to be increased recently, for example, to achieve a compact external component, and thus the pulse width of the drive signal CLK will be increasingly narrowed, it is very important to solve the above-described problems.

In view of the above described problems, an object of the present invention is to provide an electronic circuit where switch devices are securely prevented from being simultaneously turned on even when switching frequencies of the switch devices are increased.

It is also true that, in the switching power supply circuits described in Patent Documents 2 and 3, it is possible to achieve a load short-circuit protection function by use of a timer latch type protection circuit.

However, conventional timer latch type protection circuits are typically designed to monitor an output voltage as described in Patent Documents 2 and 3, and thus, even if an overcurrent is caused to flow, for example, by a short circuit of a load, no latch-off operation is activated unless an output voltage changes. Thus, in spite of provision of a timer latch type protection circuit, an overcurrent may continue flowing to damage an IC and peripheral components under a certain circuit operational condition.

In view of the above-described problem, another object of the present invention is to provide an electronic circuit capable of achieving an overcurrent protection function more securely.

It is also true that, with a conventional electronic circuit provided with an overcurrent protection function, an IC and peripheral components can be protected from damage associated with an overcurrent, and thus reliability of a set that incorporates such a conventional electronic circuit can be improved.

Many of electronic circuits provided with an overcurrent protection function are designed such that an overcurrent protection value can be adjusted as necessary via an external device for the purpose of giving the user a higher degree of freedom in setting.

However, in the conventional electronic circuit designed as described above, although the overcurrent protection value can be easily adjusted, if an abnormality such as a short circuit of and coming-off of the external device and adhesion of dust and the like to the external device occurs, or if an inadequate external device is attached, the overcurrent protection value is set to an undesired value, and as a result, the overcurrent protection function is not activated normally, which may invite damage to an IC and peripheral components under a certain circuit operational condition.

In view of the above-described problem, another object of the present invention is to provide an electronic circuit capable of preventing an IC and peripheral components from being damaged when an abnormality occurs in an overcurrent protection value.

It is also true that a conventional oscillation circuit whose oscillation frequency is set via an external device offers the user a higher degree of freedom in setting, because the user can easily adjust the oscillation frequency by replacing the external device as necessary.

However, with the conventional electronic circuit described above, if an abnormality such as a short circuit of and coming-off of the external device and adhesion of dust and the like to the external device occurs, or if an inadequate external device is attached, the overcurrent protection value is set to an undesired value, and as a result, a latter stage circuit that uses an output signal of the oscillation circuit is not activated normally, which may invite damage to an IC and peripheral components under a certain circuit operational condition.

In view of the above-described problem, another object of the present invention is to provide an electronic circuit capable of preventing an IC and peripheral components from being damaged when an abnormality occurs in an oscillation frequency.

Means for Solving the Problem

To achieve the above-described objects, according to the present invention, an electronic circuit includes a switch driver circuit for driving a first switch device and a second switch device connected in series between two different potentials. Here, the switch driver circuit includes: a first monitor unit for monitoring a first control signal fed to the first switch device to generate a first monitor signal that indicates an on/off state of the first switch device; a second monitor unit for monitoring a second control signal fed to the second switch device to generate a second monitor signal that indicates an on/off state of the second switch device; a first control unit for generating the first control signal according to a predetermined drive signal and the second monitor signal; and a second control unit for generating the second control signal according to the drive signal and the first monitor signal, the first control unit shifts a logic of the first control signal so as to latch the first switch device off using, as a trigger, reception of an instruction to turn off the first switch device given according to the drive signal, and so as to release a latched-off state of the first switch device using, as a trigger, recognition of the second switch device having been turned off obtained according to the second monitor signal, and the second control unit shifts a logic of the second control signal so as to latch the second switch device off, using, as a trigger, reception of an instruction to turn off the second switch device given according to the drive signal, and so as to release a latched-off state of the second switch device, using, as a trigger, recognition of the first switch device having been turned off obtained according to the first monitor signal (first configuration).

It is preferable that the electronic circuit having the first configuration further include an abnormality protection circuit that includes: a comparator that compares a switch voltage obtained at a connection node between the first and second switch devices and a predetermined threshold voltage when the first switch device is in an on-state; and a timer latch circuit that judges, according to a comparison signal from the comparator, whether or not a current flowing through the first switch device is in an overcurrent state, and latches the first switch device off when the overcurrent state has continued for a predetermined time period (second configuration).

In the electronic circuit having the second configuration, it is preferable that the abnormality protection circuit turn off the first switch device at a time point when the comparison signal from the comparator indicates the overcurrent state (third configuration).

In the electronic circuit having the third configuration, it is preferable that the abnormality protection circuit include a second comparator that compares an output voltage obtained by smoothing the switch voltage and a predetermined threshold voltage, and that the timer latch circuit judge, according to a comparison signal from the second comparator, whether or not the output voltage is in a reduced-voltage state, and latch the first switch device off when the reduced-voltage state has continued for a predetermined time period (fourth configuration).

It is preferable that the electronic circuit having the first configuration further include: an overcurrent protection circuit that performs an overcurrent protection operation according to an overcurrent protection value set by an external device; and a terminal abnormality protection circuit that performs a predetermined terminal abnormality protection operation when an abnormality of the overcurrent protection value is detected, that, when the first switch device is in an on-state, the overcurrent protection circuit stop switching-driving of the first switch device if it is judged that a current flowing through the first switch device is in an overcurrent state according to a comparison result between a switch voltage obtained at a connection node of the first and second switch devices and the overcurrent protection value, and that the terminal abnormality protection circuit stop switching-driving of the first switch device if it is judged that the overcurrent protection value is out of a predetermined limit range (fifth configuration).

In the electronic circuit having the fifth configuration, it is preferable that the terminal abnormality protection circuit include a pnp-type bipolar transistor a base of which is connected to a terminal to which the overcurrent protection value is applied, an emitter of which is connected to a terminal to which is applied a switch voltage that is obtained when the first switch device is in an on-state, and from a collector of which a terminal abnormality protection signal is extracted (sixth configuration).

In the electronic circuit having the sixth configuration, it is preferable that the terminal abnormality protection circuit include a diode or a diode-connected transistor, an anode of which is connected to the base of the pnp-type bipolar transistor and a cathode of which is connected to the terminal to which the overcurrent protection value is applied (seventh configuration).

In the electronic circuit having the fifth configuration, it is preferable that the terminal abnormality protection circuit include a comparator that compares the overcurrent protection value and a predetermined threshold value, and outputs a comparison result as a terminal abnormality protection signal (eighth configuration).

It is preferable that the electronic circuit having the sixth configuration further include a timer latch circuit that judges whether or not the overcurrent protection value is in an abnormal state according to the terminal abnormality protection signal, and latches the first switch device off when the abnormal state has continued over a predetermined time period (ninth configuration).

It is preferable that the electronic circuit having the eighth configuration further include a timer latch circuit that judges whether or not the overcurrent protection value is in an abnormal state according to the terminal abnormality protection signal, and latches the first switch device off when the abnormal state has continued over a predetermined time period (tenth configuration).

It is preferable that the electronic circuit having the first configuration further include: an oscillation circuit an oscillation frequency of which is set by an external device; and an oscillation abnormality protection circuit that performs a predetermined oscillation abnormality protection operation when an abnormality of the oscillation frequency is detected, that switching frequencies of the first and second switch devices be set by an oscillation frequency of the oscillation circuit, and that the oscillation abnormality protection circuit stop switching driving of the first switch device when the oscillation frequency is out of a predetermined limit range (eleventh configuration).

In the electronic circuit having the eleventh configuration, it is preferable that the oscillation circuit include a resistor and a capacitor each as the external device, charge and discharge the capacitor by using a standard current generated by applying a predetermined voltage to a first terminal of the resistor, and output a terminal voltage of the capacitor as an oscillation signal, and that the oscillation abnormality protection circuit monitor at least one of the standard current, a terminal voltage of the resistor, and the terminal voltage of the capacitor, and generate an oscillation abnormality protection signal according to a monitor result (twelfth configuration).

It is preferable that the electronic circuit having the twelfth configuration further include a timer latch circuit that judges whether or not the overcurrent protection value is in an abnormal state according to the terminal abnormality protection signal, and latches the first switch device off when the abnormal state has continued over a predetermined time period (thirteenth configuration).

Advantages of the Invention

With an electronic circuit of the present invention, switching devices can be securely prevented from being simultaneously turned on even when switching frequencies of the switch devices are increased. This helps protect a device from destruction and prevent reduction of efficiency, and thus makes it possible to improve reliability of a set that incorporates the electronic circuit.

Also, with an electronic circuit of the present invention, unlike with a conventional timer latch type one, an overcurrent state can be detected without delay and thus a protection operation can be performed quickly regardless of a behavior of an output voltage, and this makes it possible to achieve an overcurrent protection function more securely, and thus to improve the reliability of the set that incorporates the electronic circuit.

Also, with an electronic circuit of the present invention, there is no need of inserting a sense resistor as overcurrent detection means, and this helps achieve lower cost and improved output efficiency.

Also, with an electronic circuit of the present invention, an IC and peripheral components are protected from destruction even when an abnormality occurs in an overcurrent protection value, and thus the reliability of the set that incorporates the electronic circuit can be improved.

Also, with an electronic circuit of the present invention, an IC and peripheral components are protected from destruction even when an abnormality occurs in an oscillation frequency, and this helps improve the reliability of the set that incorporates the electronic circuit.

BRIEF DESCRIPTION OF DRAWINGS

FIG. 12A is a circuit diagram showing an example of a configuration of an abnormal current detection unit 68a;

FIG. 12B is a circuit diagram showing another example of the configuration of the abnormal current detection unit 68a;

Figure 1:
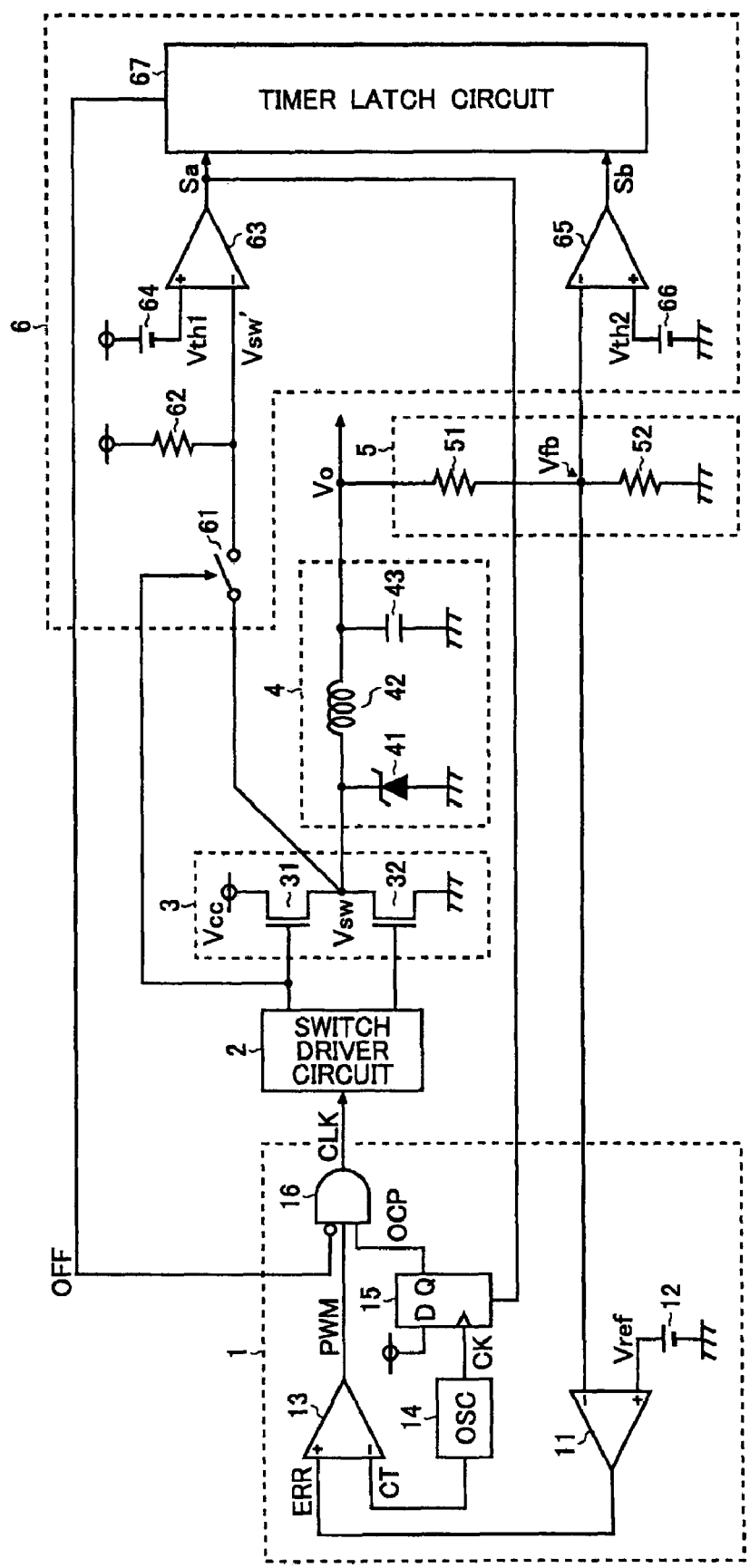
FIG. 1 is a circuit block diagram showing a switching regulator embodying the present invention.

LIST OF REFERENCE SYMBOLS 1 control circuit
2 switch driver circuit
3 output circuit
4 smoothing circuit
5 voltage divider circuit
6 abnormality protection circuit
11 error amplifier
12 direct current voltage supply
13 PWM comparator
14 oscillator circuit
14a, 14b, 14c pnp-type bipolar transistors
14d npn-type bipolar transistor
14e, 14f external terminals
14g resistor
14h capacitor
14i, 14j pnp-type bipolar transistors
14k switch
14l switch control unit
14m clock signal generating unit
15 D flip-flop
16 AND operator (AND)
21 upper control unit
21a inverter (INV)
21b AND operator (AND)
21c, 21d NAND operators (NANDs)
21e And operator (AND)
22 upper driver unit
23 upper monitor unit
23a comparator
23b direct current voltage supply
23b inverter
25 lower control unit
25a, 25b, 25c NAND operators (NANDs)
25d NOR operator (NOR)
26 lower driver unit
27 lower monitor unit
27a comparator
27b direct current voltage supply
31 N-channel field effect transistor (output transistor)
32 N-channel field effect transistor (synchronous rectifier transistor)
41 Schottky diode
42 inductor
43 capacitor
51, 52 resistors
61 switch
62 resistor
63 comparator
64 direct current voltage supply
64a resistor (external)
64b constant current supply
64c external terminal
65 comparator
66 direct current voltage supply
67 timer latch circuit
67a NOR operator (NOR)
67b timer control circuit
67c constant current supply
67d switch
67e capacitor
67f comparator
67g direct current voltage supply
68 terminal abnormality detection circuit
68a pnp-type bipolar transistor
68b resistor
68c npn-type bipolar transistor
68d comparator
68e comparator
68f direct current voltage supply
69 oscillation abnormality protection circuit
69a abnormal current detection unit
69b, 69c abnormal voltage detection units
69d pnp-type bipolar transistor
N1, N2 npn-type bipolar transistors
R1, R2, R3 resistors
CMP1, CMP2 comparators
E1, E2 direct current voltage supplies

BEST MODE FOR CARRYING OUT THE INVENTION

A detailed description will be given below dealing with, as an example, a case where the present invention is applied to a step-down switching regulator.

FIG. 1 is a circuit block diagram showing a switching regulator embodying the present invention.

As shown in the figure, the switching regulator of this embodiment includes, as circuit blocks, a control circuit 1, a switch driver circuit 2, an output circuit 3, a smoothing circuit 4, a voltage divider circuit 5, and an abnormality protection circuit 6.

The control circuit 1 is means for generating a drive signal CLK to be fed to the switch driver circuit 2 such that a desired output voltage Vo can be obtained from a power supply voltage Vcc. The control circuit 1 includes an error amplifier 11, a direct current voltage supply 12, a PWM (pulse width modulation) comparator 13, an oscillation circuit 14, a D flip-flop 15, and an AND operator 16 (hereinafter, AND 16).

A non-inverting input terminal (+) of the error amplifier 11 is connected to a positive terminal of the direct current voltage supply 12 and a predetermined reference voltage Vref (which corresponds to a set target level of the output voltage Vo) is applied thereto. A negative terminal of the direct current voltage supply 12 is connected to a ground terminal. An inverting input terminal (−) of the error amplifier 11 is connected to a feedback voltage output terminal of the voltage divider circuit 5 from which the feedback voltage is outputted (i.e., a connection node between resistors 51 and 52, which will be described later), and a feedback voltage Vfb (which corresponds to an actual value of the output voltage Vo) is applied to the inverting input terminal (−) of the error amplifier 11.

A non-inverting input terminal (+) of the PWM comparator 13 is connected to an output terminal of the error amplifier 11, and an error signal ERR is applied thereto. An inverting output terminal (−) of the PWM comparator 13 is connected to a first output terminal of the oscillation circuit 14, and a triangular waveform signal CT having a predetermined frequency is applied thereto.

A data input terminal (D) of the D flip-flop 15 is connected to a power supply voltage Vcc application terminal to which the power supply voltage Vcc is applied. A clock input terminal of the D flip-flop 15 is connected to a second output terminal of the oscillation circuit 14, and a clock signal CK, which is in a pulse state and has a same frequency as the above-mentioned triangular waveform signal CT, is applied thereto.

A first input terminal of the AND 16 is connected to an output terminal of the PWM comparator 13, and a pulse width modulation signal PWM is applied thereto. A second input terminal of the AND 16 is connected to an output terminal (Q) of the D flip-flop 15, and an overcurrent protection signal OCP is applied thereto. A third input terminal of the AND 16 is connected to a latch-off signal output terminal of the abnormality protection circuit 6, and a latch-off signal OFF is invertedly applied thereto. An output terminal of the AND 16 corresponds to a drive signal CLK output terminal from which the drive signal CLK is outputted, and is connected to a drive signal input terminal of the switch driver circuit 2.

The switch driver circuit 2 is means for controlling driving of the output circuit 3 (that is, for controlling generation of first and second control signals) according to the drive signal CLK fed from the control circuit 1. A detailed description will be given later of a configuration and operation of the switch driver circuit 2.

The output circuit 3 includes: an N-channel field effect transistor (output transistor) 31 and an N-channel field effect transistor (synchronous rectifying transistor) 32 as a pair of switches that are connected in series between the power supply voltage Vcc application terminal and a ground terminal, and the output circuit 3 is means for generating a switch voltage Vsw in a pulse state by driving the switches such that they are turned on and off complementarily to each other. Incidentally, a drain of the transistor 31 is connected to the power supply voltage Vcc application terminal, A drain of the transistor 32 is connected to the ground terminal. Sources of the transistors 31 and 32 are connected to each other, and a connection node between them corresponds to a switch voltage Vsw output terminal from which the switch voltage Vsw is outputted. A gate of the transistor 31 is connected to a first control signal output terminal of the switch driver circuit 2 and a gate of the transistor 32 is connected to a second control signal output terminal of the switch driver circuit 2.

It should be understood that the term "complementarily" used in this specification covers not only cases where the turning on and off of the transistor 31 and that of the transistor 32 take place exactly oppositely to each other but also cases where, from the perspective of preventing a through current, the turning on and off of the transistor 31 takes place with a predetermined delay relative to that of the transistor 32.

The smoothing circuit 4 is means for smoothing the switch voltage Vsw to generate a desired output voltage Vo, and includes a Schottky diode 41, an inductor 42, and a capacitor 43. A cathode of the Schottky diode 41 is connected to the switch voltage output terminal of the output circuit 3. An anode of the Schottky diode 41 is connected to a ground terminal. A first end of the inductor 42 is connected the switch voltage Vsw output terminal of the output circuit 3. A second end of the inductor 42 is connected to a first terminal of the capacitor 43. A second terminal of the capacitor 43 is connected to a ground terminal. Incidentally, the first terminal of the capacitor 43 corresponds to an output voltage Vo output terminal form which the output voltage Vo is outputted.

The voltage divider circuit 5 is means for generating the feedback voltage Vfb by dividing the output voltage Vo, and includes resistors 51 and 52. The resistors 51 and 52 are connected in series between the output voltage Vo output terminal and a ground terminal, and a connection node between them corresponds to the feedback voltage Vfb output terminal.

The abnormality protection circuit 6 is means for performing a predetermined protection operation when an abnormality of the switching regulator is detected, and includes a switch 61, a resistor 62, a comparator 63, a direct current voltage supply 64, a comparator 65, a direct current voltage supply 66, and a timer latch circuit 67.

A first end of the switch 61 is connected to the switch voltage output terminal of the output circuit 3. An opening/closing control terminal of the switch 61 is connected to the first control signal output terminal of the switch driver circuit 2. That is, the switch 61 is switching-controlled synchronously with the transistor 31. More specifically, the switch 61 is controlled such that it is in an on state when the transistor 31 is in an on state, and it is in an off state when the transistor 31 is in an off state.

An inverting input terminal (−) of the comparator 63, which is connected to a second end of the switch 61, is also connected to the power supply voltage Vcc application terminal via the resistor 62, and a switch voltage Vsw' is applied to the inverting input terminal (−) of the comparator 63. A non-inverting input terminal (+) of the comparator 63 is connected to a negative terminal of the direct current voltage supply 64, and a threshold voltage Vth1 is applied to the non-inverting input terminal (+) of the comparator 63. A positive terminal of the direct current voltage supply 64 is connected to the power supply voltage Vcc application terminal. An output terminal of the comparator 63, which is connected to a first comparison signal input terminal of the timer latch circuit 67, is also connected to a reset-input terminal of the D flip-flop 15 with which the control circuit 1 is formed.

An inverting input terminal (−) of the comparator 65 is connected to the feedback voltage Vfb output terminal of the voltage divider circuit 5, and the feedback voltage Vfb is applied to the inverting input terminal (−) of the comparator 65. A non-inverting input terminal (+) of the comparator 65 is connected to a positive terminal of the direct current voltage supply 66, and a threshold voltage Vth2 is applied to the non-inverting input terminal (+) of the comparator 65. A negative terminal of the direct current voltage supply 66 is connected to a ground terminal. An output terminal of the comparator 65 is connected to a second comparison signal input terminal of the timer latch circuit 67.

First, a description will be given of basic operation (that is, output voltage Vo stabilizing control) of the switching regulator configured as described above.

In the control circuit 1, the error amplifier 11 generates the error signal ERR by amplifying a difference between the feedback voltage Vfb and the reference voltage Vref. The PWM comparator 13 generates the pulse width modulation signal PWM by comparing the error signal ERR with the triangular waveform signal CT. At this time, logic level of the pulse width modulation signal PWM is high if the error signal ERR is higher than the triangular waveform signal CT in potential, and the logic level of the pulse width modulation signal PWM is low if the triangular waveform signal CT is higher than the error signal ERR in potential. That is, the higher the error signal ERR is in potential, the longer a high-level period is in one cycle of the pulse width modulation signal PWM (and thus, an on-duty of the transistor 31 is longer), while the lower the error signal ERR is in potential, the shorter the high-level period is in one cycle of the pulse width modulation signal PWM.

The switch driver circuit 2 generates gate signals of the transistors 31 and 32 (the first and second control signals, respectively) according to the pulse width generation signal PWM fed via the AND 16.

By such feedback control of the output voltage Vo, the transistors 31 and 32 are switching-controlled such that the feedback voltage Vfb is equal to the predetermined reference voltage Vref, in other words, the output voltage Vo is equal to the target level set as desired.

Next, a detailed description will be given of an overcurrent protection operation of the switching regulator configured as described above, with reference to FIG. 2, as well as FIG. 1 which has been already referred to.

Figure 2:
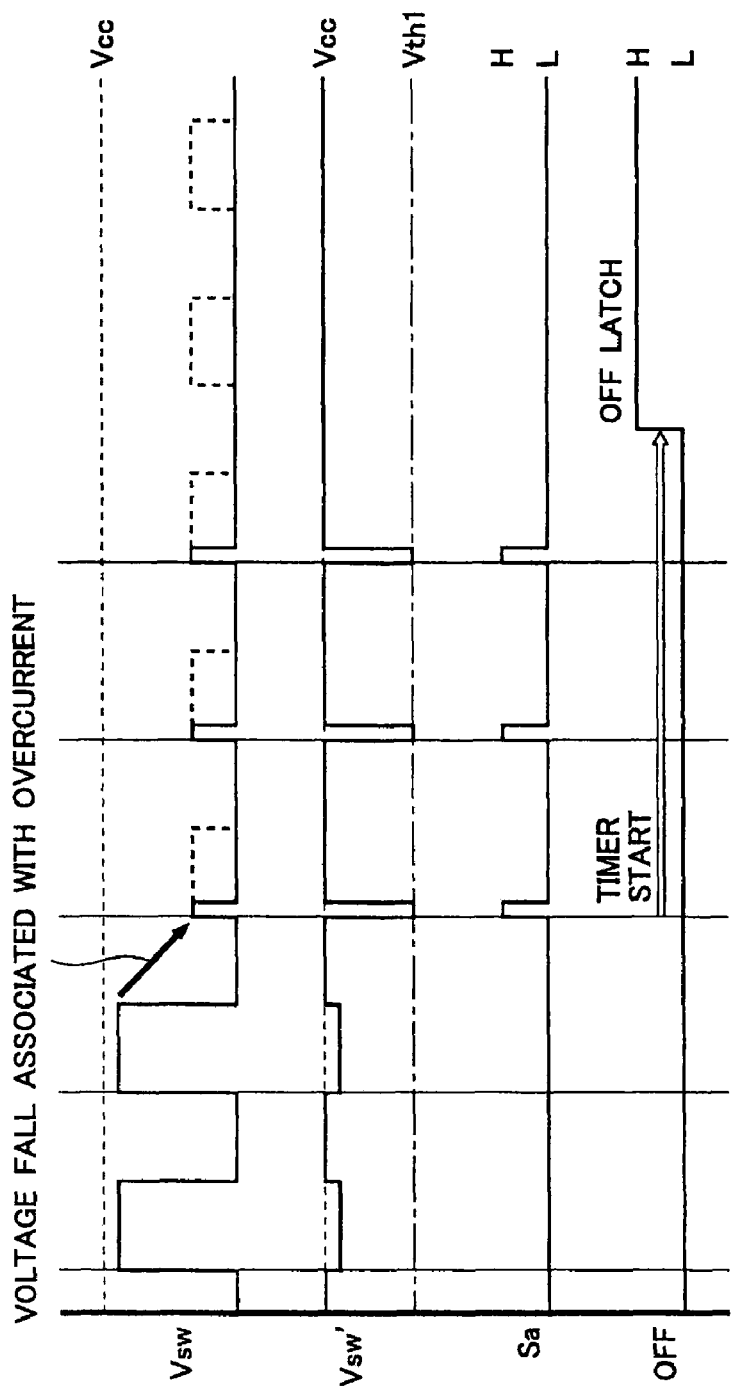
FIG. 2 is a timing chart for illustrating an example of an overcurrent protection operation (a timer latch operation)

FIG. 2 is a timing chart for illustrating an example of an overcurrent protection operation (a timer latch operation). In this figure, there are shown behaviors of the switch voltage Vsw, the switch voltage Vsw', the first comparison signal Sa, and the latch-off signal OFF.

As already described, the switch 61 is inserted between the switch voltage Vsw output terminal and the inverting input terminal (−) of the comparator 63 in the output circuit 3, and the switch 61 is controlled such that it is in an on state when the transistor 31 is in an on state and it is in an off state when the transistor 31 is in an off state. On the other hand, the inverting input terminal (−) of the comparator 63 is pulled-up to the power supply voltage Vcc application terminal via the resistor 62. Thus, as shown in FIG. 2, the switch voltage Vsw' that is applied to the inverting input terminal (−) of the comparator 63 is equal to the switch voltage Vsw when the transistor 31 is in an on state, and is equal to the power supply voltage Vcc when the transistor 31 is in an off state.

Here, the voltage level of the switch voltage Vsw that is obtained when the transistor 31 is equal to one obtained by subtracting a result of multiplying an on-resistance Ron of the transistor 31 by a current "I" that flows through the transistor 31 from the power supply voltage Vcc (that is, Vcc−Ron×I), and thus, if the on-resistance Ron of the transistor 31 is assumed to remain constant, the voltage level of the switch voltage Vcc reduces as the current "I" increases.

Thus, an overcurrent (short circuit current) can be detected through comparison between the switch voltage Vsw' and a predetermined threshold voltage Vth1 performed by the comparator 63. Incidentally, in this embodiment, if the switch voltage Vsw' is higher than the threshold voltage Vth1, the first comparison signal Sa is low level (a logic indicating a normal state), and in contrast, if the switch voltage Vsw' is lower than the threshold voltage Vth1, the first comparison signal Sa is high level (a logic indicating an overcurrent state).

On the other hand, the D flip-flop 15, with which the control circuit 1 is formed, is reset at a rising edge of the first comparison signal Sa, and shifts the overcurrent protection signal OCP, which is an output of the D flip-flop 15, to low level. This results in the AND 16 cutting off a transmission path of the pulse width modulation signal PWM. Such signal interruption continues until the D flip-flop reads, at the rising edge of a following clock signal CK, the power supply voltage Vcc fed through its data input terminal (D) and the overcurrent protection signal OCP is shifted to high level.

That is, the overcurrent protection operation described above (hereinafter, the first overcurrent protection operation) includes the monitoring of the switch voltage Vsw and the turning-off of the current cycle of the output operation as soon as the first comparison signal Sa indicates an overcurrent state, the output operation restarting thereafter in response to the clock signal CK to start the next cycle thereof. With this configuration, since there is no need of inserting a sense resistor in an output voltage Vo supply path as overcurrent detection means, cost reduction and improved output efficiency can be achieved.

In the switching regulator of this embodiment, the abnormality protection circuit 6 is provided with the timer latch circuit 67 as means for performing, in addition to the above-described first overcurrent protection operation, a second overcurrent protection operation.

The timer latch circuit 67 judges whether or not a current flowing through the transistor 31 is in an overcurrent state according to the first comparison signal Sa, and, when an overcurrent state has continued over a predetermined period, shifts a logic of the latch-off signal OFF such that the transistor 31 is latched off.

More specifically, as shown in FIG. 2, the timer latch circuit 67 of this embodiment starts a time-counting operation of a timer at a rising edge of the first comparison signal Sa, and when a predetermined time has elapsed, shifts the logic of the latch-off signal OFF from low level (a logic that indicates a normal state) to high level (a logic state that indicates an overcurrent state), and maintains the logic state.

On the other hand, the AND 16, with which the control circuit 1 is formed, cuts off the transmission path of the pulse width modulation signal PWM according to the latch-off signal OFF that is invertedly inputted thereto.

Thus, with the second overcurrent protection operation, unlike with the conventional timer latch type overcurrent protection operation where the output voltage Vo is monitored, it is possible to detect an overcurrent state without delay regardless of the behavior of the output voltage Vo, and the overcurrent protection operation can be quickly performed, and thus an IC and peripheral components can be protected from damage, and reliability of a set incorporating the switching regulator can be improved.

Also, with the switching regulator of this embodiment, since the first overcurrent protection operation functions during a timer period until the second overcurrent protection operation starts functioning, an overcurrent occurring during the timer period can be properly controlled, and also, in a case where the overcurrent state continues thereafter, the output operation can be completely latched off by the second overcurrent protection operation. Thus, an IC and peripheral components can be protected from damage more securely.

Also, in the switching regulator of this embodiment, the abnormality protection circuit 6 includes the comparator 65, which is a second comparator, for comparing the feedback voltage Vfb with the threshold voltage Vth2, and the timer latch circuit 67 judges whether or not the output voltage Vo is in a reduced-voltage state according to not only the first comparison signal Sa but also a second comparison signal Sb outputted from the comparator 65, and latches the transistor 31 off when the reduced-voltage state has continued over a predetermined period.

With such a reduced-voltage protection operation, since a reduced-voltage state associated with a short circuit of an output terminal or an overload can be detected without delay and a protection operation can be performed quickly, an IC and periphery components can be protected from damage, and reliability of a set incorporating the switching regulator can be improved. Also, even if the above-described second overcurrent protection operation does not normally function for some reason when an overcurrent is flowing, the output voltage Vo gradually decreases as long as the above-described first overcurrent protection operation normally functions, and thus the transistor 31 can eventually be latched off by the first overcurrent protection operation.

Incidentally, with respect to restart of the output operation after it is latched off, the output operation may be restarted in response to, for example, an externally fed enable signal, or the output operation may be automatically restarted by use of an additionally incorporated timer or the like.

Next, a description will be given of an example of a configuration of the timer latch circuit 67 with reference to FIG. 3.

Figure 3:
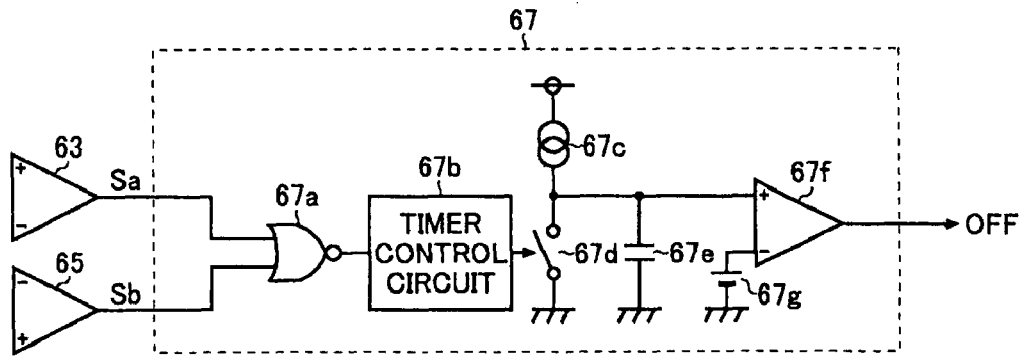
FIG. 3 is a circuit block diagram showing an example of a configuration of a timer latch circuit 67.

FIG. 3 is a circuit block diagram showing the example of the configuration of the timer latch circuit 67.

As shown in this figure, the timer latch circuit 67 of this example includes a NOR operator 67 (hereinafter, NOR 67a), a timer control circuit 67b, a constant current supply 67c, a switch 67d, a capacitor 67e, a comparator 67f, and a direct current voltage supply 67g.

A first input terminal of the NOR 67a corresponds to the first comparison signal Sa input terminal to which the first comparison signal Sa is inputted, and is connected to the output terminal of the comparator 63. A second input terminal of the NOR 67a corresponds to the second comparison signal Sb input terminal to which the second comparison signal Sb is inputted, and is connected to the output terminal of the comparator 65. A first terminal of the constant current supply 67c is connected to a power supply voltage Vcc application terminal. A second terminal of the constant current supply 67c is connected to a first end of the switch 67d, a first terminal of the capacitor 67e, and a non-inverting input terminal (+) of the comparator 67f. A second end of the switch 67d and a second terminal of the capacitor 67e are each connected to a ground terminal. An inverting input terminal (−) of the comparator 67f is connected to a positive terminal of the direct current voltage supply 67g. A negative terminal of the direct current voltage supply 67g is connected to a ground terminal. An output terminal of the comparator 67f corresponds to the latch-off signal OFF output terminal.

The timer control circuit 67b turns on the switch 67d from an off state when an output logic of the NOR 67a is shifted from high level to low level, that is, when either an overcurrent state or a reduced-voltage state is detected. Incidentally, since the first comparison signal Sa is a pulse signal having a predetermined cycle while an overcurrent state is being detected, the output logic of the NOR 67a is also a pulse signal having the same cycle as mentioned above; here, it is preferable that the timer control circuit 67b be configured such that it keeps the switch 67d in an off state while the pulse signal is being continuously inputted at the above mentioned cycle and it turns the switch 67d on when input of the above mentioned pulse stops.

When the switch 67d is turned off from an on state, a constant current generated at the constant current supply 67c flows to the ground terminal via the capacitor 67e, and the capacitor 67e starts to be charged. When a terminal voltage (charging voltage) obtained at the first terminal of the capacitor 67e has risen up to a predetermined threshold voltage generated at the direct current voltage supply 67g, an output logic of the comparator 67f (that is, the output logic of the latch-off signal OFF) is shifted from low level to high level.

With the timer latch circuit 67 having the configuration described above, a timer latch operation can be achieved with a very simple configuration. Incidentally, the time period between a start of the timer and a latch-off can be set as necessary by adjusting a constant current value of the constant current supply 67c, capacitance of the capacitor 67e, and a threshold voltage of the direct current voltage supply 67g.

However, the above description is not meant to limit the configuration of the timer latch circuit 67, and, for example, a digital counter may be used.

Next, a detailed description will be given of the configuration of the switch driver circuit 2 with reference to FIG. 4.

Figure 4:
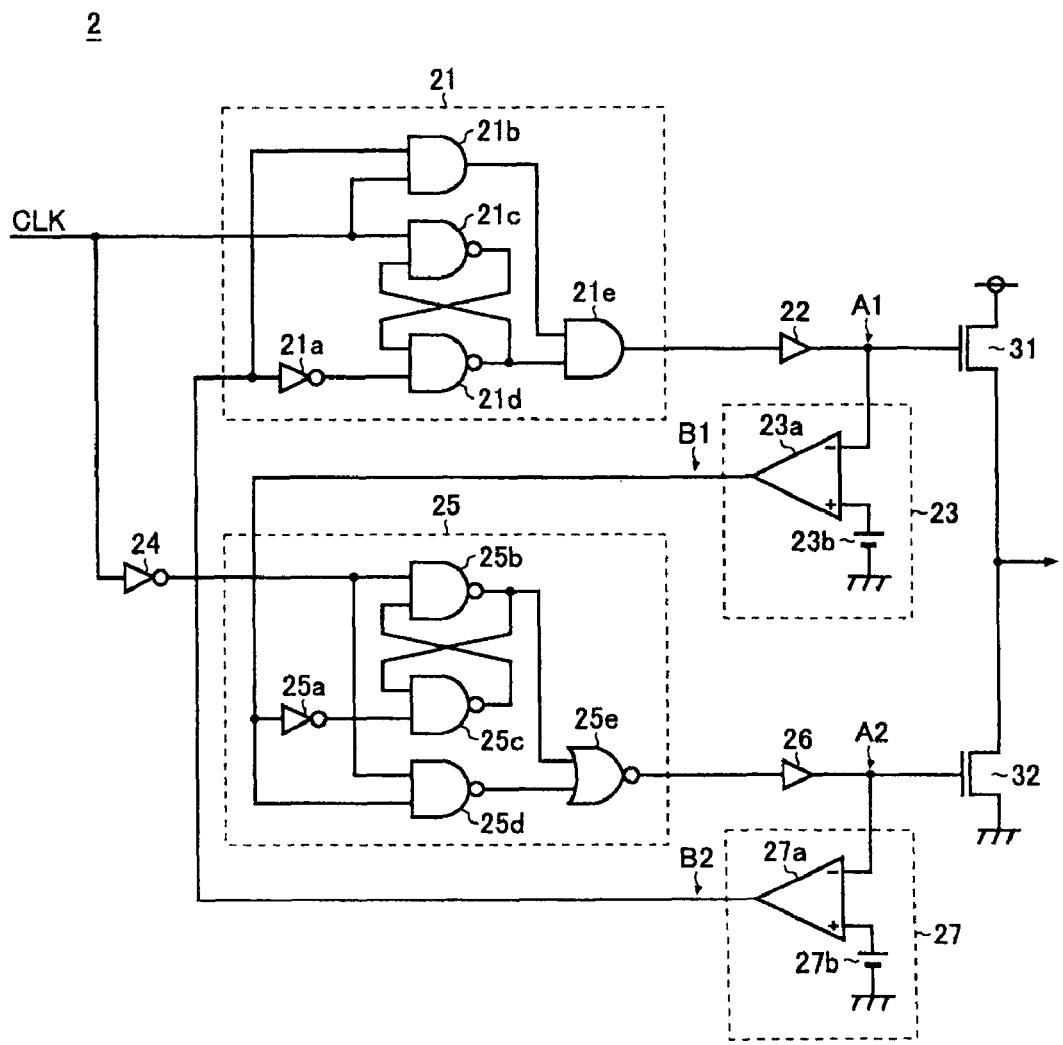
FIG. 4 is a circuit block diagram showing an example of a configuration of a switch driver circuit 2.

FIG. 4 is a circuit block diagram showing an example of a configuration of the switch driver circuit 2.

As shown in FIG. 4, the switch driver circuit 2 of this example includes an upper control unit 21, an upper driver unit 22, an upper monitor unit 23, an inverter 24, a lower control unit 25, a lower driver unit 26, and a lower monitor unit 27.

The upper control unit 21 is means for generating a gate signal A1 according to the drive signal CLK from the control circuit 1 and a monitor signal B2, and includes an inverter 21a (hereinafter, INV 21a), an AND operator 21b (hereinafter, AND 21b), NAND operators 21c and 21d (hereinafter, NANDs 21c and 21d), and an AND operator 21e (hereinafter, AND 21e). Incidentally, in the upper control unit 21 of this example, the NAND 21c and the NAND 21d form an RS flip-flop.

An input terminal of the INV 21a is connected to a monitor signal B2 application terminal to which the monitor signal B2 is applied. An output terminal of the INV 21a is connected to a first input terminal of the NAND 21d (which corresponds to a set-input terminal (S) of the RS flip-flop). A second terminal of the NAND 21d is connected to an output terminal of the NAND 21c. An output terminal of the NAND 21d (which corresponds to an output terminal (Q) of the RS flip-flop) is connected to a first input terminal of the NAND 21c and is also connected to a first input terminal of the AND 21e. A second input terminal of the NAND 21c (which corresponds to a reset-input terminal (R) of the RS flip-flop) is connected to the drive signal CLK application terminal. A first input terminal of the AND 21b is connected to the monitor signal B2 application terminal. A second input terminal of the AND 21b is connected to the drive signal CLK application terminal. An output terminal of the AND 21b is connected to a second input terminal of the AND 21e. An output terminal of the AND 21e is connected to the gate of the transistor 31 via the upper driver unit 22.

The upper driver unit 22 is means for feeding the gate signal A1 generated at the upper control unit 21 to the gate of the transistor 31 after performing, for example, level shift on the gate signal A1.

The upper monitor unit 23 is means for monitoring the gate signal A1 to generate a monitor signal B1 that indicates the on/off state of the transistor 31, and includes a comparator 23a and a direct current voltage supply 23b. An inverting input terminal (−) of the comparator 23a is connected to the gate of the transistor 31. A non-inverting input terminal (+) of the comparator 23a is connected to a positive terminal of the direct current voltage supply 23b. A negative terminal of the direct current voltage supply 23b is connected to a ground terminal. An output terminal of the comparator 23a corresponds to a monitor signal B1 output terminal.

The lower control unit 25 is means for generating a gate signal A2 according to the drive signal CLK from the control circuit 1 and the monitor signal B1, and includes an inverter 25a (hereinafter, INV 25a), NAND operators 25b, 25c, and 25d (hereinafter, NANDs 25b, 25c, and 25d), and a NOR operator 25e (hereinafter, AND 25e). In the lower control unit 25 of this example, the NAND 25b and the NAND 25c form an RS flip-flop.

An input terminal of the INV 25a is connected to a monitor signal B1 application terminal to which the monitor signal B1 is applied. An output terminal of the INV 25a is connected to a first input terminal of the NAND 25c (which corresponds to a reset-input terminal (R) of the RS flip-flop). A second input terminal of the NAND 25c is connected to an output terminal of the NAND 25b. An output terminal of the NAND 25c is connected to a first input terminal of the NAND 25b. A second input terminal of the NAND 25b (which corresponds to a set-input terminal (S) of the RS flip-flop) is connected to an output terminal of an inverter 24. An output terminal of the NAND 25b (which corresponds to an output terminal (Q) of the RS flip-flop) is connected to a first input terminal of the NOR 25e. A second input terminal of the NOR 25e is connected to an output terminal of the NAND 25d. A first input terminal of the NAND 25d is connected to an output terminal of the inverter 24. A second input terminal of the NAND 25d is connected to the monitor signal B1 application terminal. An output terminal of the NOR 25e is connected to the gate of the transistor 32 via the lower driver unit 26.

The lower driver unit 26 is means for feeding the gate signal A2 generated at the lower control unit 25 to the gate of the transistor 32 after performing, for example, level shift on the gate signal A2.

The lower monitor unit 27 is means for monitoring the gate signal A2 to generate the monitor signal B2 that indicates the on/off state of the transistor 32, and includes a comparator 27a and a direct current voltage supply 27b. An inverting input terminal (−) of the comparator 27a is connected to the gate of the transistor 32. A non-inverting input terminal (+) of the comparator 27a is connected to a positive terminal of the direct current voltage supply 27b. A negative terminal of the direct current voltage supply 27b is connected to a ground terminal. An output terminal of the comparator 27a corresponds to a monitor signal B2 output terminal.

Next, a detailed description will be given of the switching driving performed by the switch driver circuit 2 (specifically, an operation for preventing the transistors 31 and 32 from being simultaneously turned on) with reference to FIG. 5.

Figure 5:
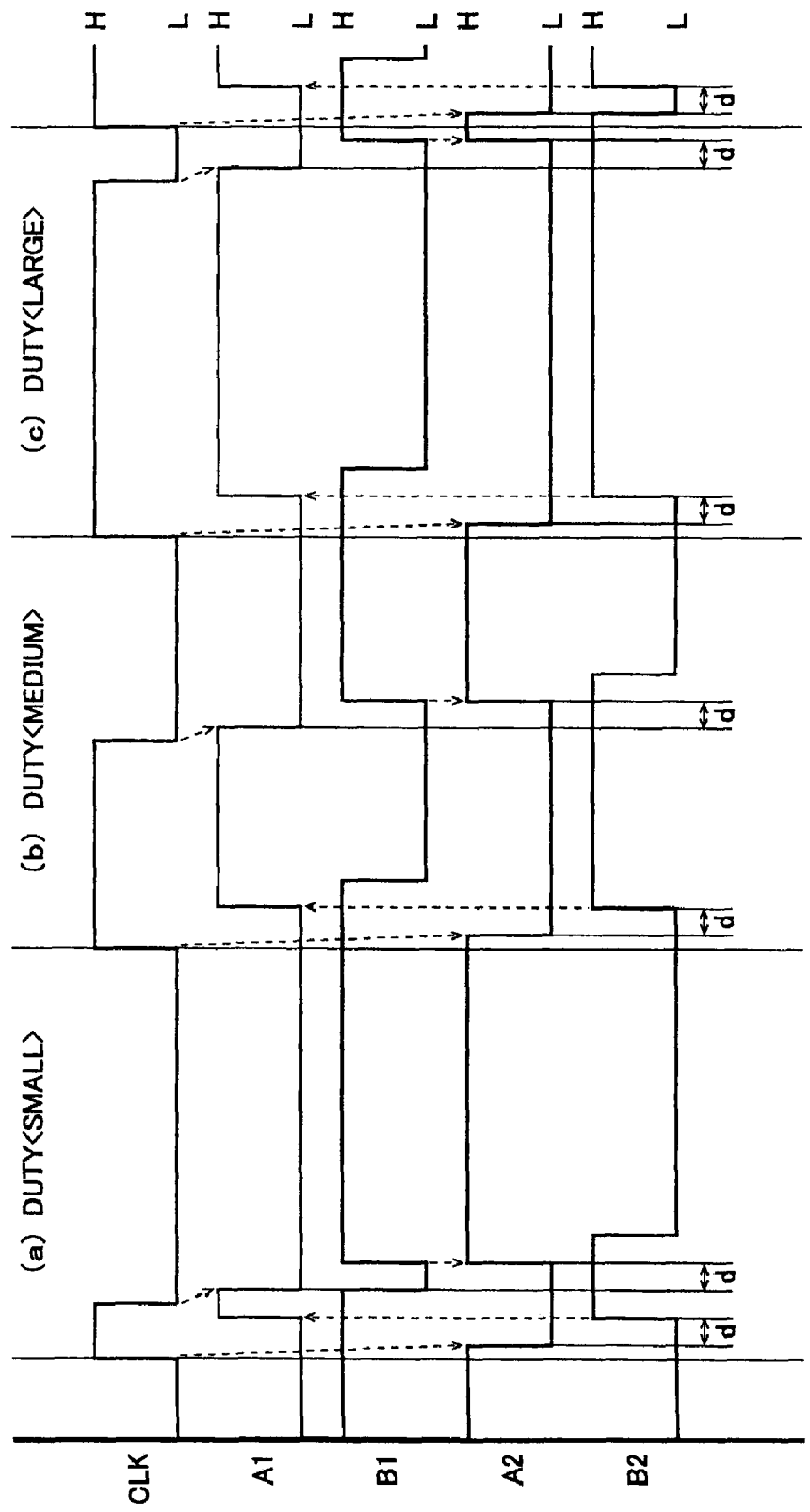
FIG. 5 is a timing chart for illustrating switching driving by the switch driver circuit 2.

FIG. 5 is a timing chart for illustrating switching driving performed by the switch driver circuit 2.

When a logic of the drive signal CLK is shifted from low level (L) to high level (H), in the lower control unit 25, an output logic of the NAND 25d is shifted from low level (L) to high level (H), and an output logic of the RS flip-flop is shifted from low level (L) to high level (H) with a falling edge of a set signal (the drive signal CLK that is invertedly inputted thereto via the inverter 24) used as a trigger. Thus, an output logic of the NOR 25e (that is, a logic of the gate signal A2) is shifted from high level (H) to low level (L), and thus the transistor 32 is turned off.

When the logic of the gate signal A2 is shifted to low level (L), a logic of the monitor signal B2 is shifted from low level (L) to high level (H). Meanwhile, in the upper control unit 21, an output logic of the AND 21b is shifted from low level (L) to high level (H), and the output logic of the RS flip-flop is shifted from low level (L) to high level (H) with a falling edge of a set signal (that is, the monitor signal B2 that is invertedly inputted thereto via the INV 21a) used as a trigger. Thus, an output logic of the AND 21e (that is, the logic of the gate signal A1) is shifted from low level (L) to high level (H), and thus the transistor 31 is turned on.

Here, a time period "d" from when the logic of the gate signal A2 is shifted to low level (L) until when the logic of the gate signal A1 is shifted to high level (H) is a simultaneous OFF period during which the transistors 31 and 32 are simultaneously turned off. Incidentally, the simultaneous OFF period "d" may be allocated by using only a delay time that the lower monitor unit 27 takes to output a comparison result, or by using an extra delay circuit inserted into an output stage of the lower monitor unit 27.

When the logic of the gate signal A1 is shifted to high level (H), the logic of the monitor signal B1 is shifted from high level (H) to low level (L). Meanwhile, in the lower control unit 25, the output logic of the NAND 25d is continuously maintained high level (H) regardless of the logic of the drive signal CLK. The output logic of the RS flip-flop is also continuously maintained high level (H). Thus, the output logic of the NOR 25e (that is, the logic of the gate signal A2) is continuously maintained low level (L), and thus the transistor 32 is continuously maintained in an off state.

On the other hand, when the logic of the drive signal CLK is shifted from high level (H) to low level (L), in the upper control unit 21, the output logic of the AND 21b is shifted from high level (H) to low level (L), and the output logic of the RS flip-flop is shifted from high level (H) to low level (L) with a falling edge of a reset signal (that is, the drive signal CLK) used as a trigger. Thus, the output logic of the AND 21e (that is, the logic of the gate signal A1) is shifted from high level (H) to low level (L), and thus the transistor 31 is turned off.

When the logic of the gate signal A1 is shifted to low level (L), the logic of the monitor signal B1 is shifted from low level (L) to high level (H). Meanwhile, in the lower control unit 25, the output logic of the NAND 25d is shifted from high level (H) to low level (L), and the output logic of the RS flip-flop is shifted from high level (H) to low level (L) with a falling edge of a reset signal (that is, the monitor signal B1 that is invertedly inputted thereto via the INV 25a) used as a trigger. Thus, the output logic of the NOR 25e (that is, the logic of the gate signal A1) is shifted from low level (L) to high level (H), and thus the transistor 32 is turned on.

Here, a time period "d" from when the logic of the gate signal A1 is shifted to low level (L) until when the logic of the gate signal A2 is shifted to high level (H) is a simultaneous OFF period during which the transistors 31 and 32 are simultaneously turned off. Incidentally, the simultaneous OFF period "d" may be allocated by using only a delay time the upper monitor unit 23 takes to output a comparison result, or by using an extra delay circuit inserted into an output stage of the upper monitor unit 23.

When the logic of the gate signal A2 is shifted to high level (H), the logic of the monitor signal B2 is shifted from high level (H) to low level (L). Meanwhile, in the upper control unit 21, the output logic of the AND 21b is continuously maintained low level (L) regardless of the logic of the drive signal CLK. The output logic of the RS flip-flop is also continuously maintained low level (L). Thus, the output logic of the AND 21e (that is, the logic of the gate signal A1) is continuously maintained low level (L), and thus the transistor 31 is continuously maintained in an off state.

Figure 6:
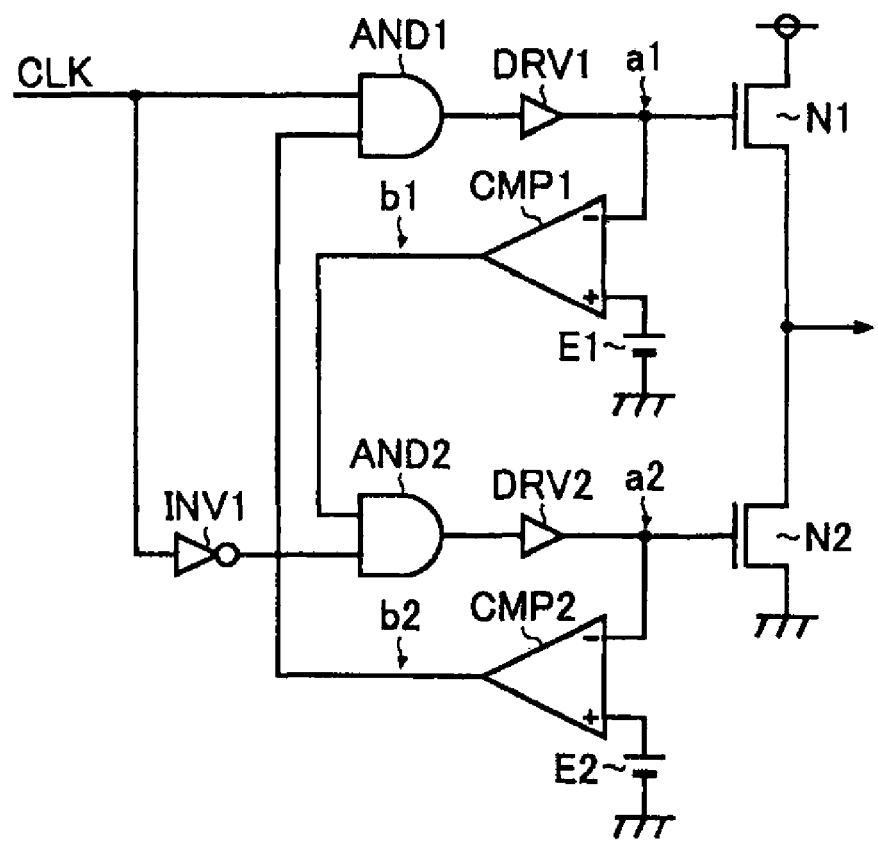
FIG. 6 is a circuit block diagram showing a conventional example of a switch driver circuit.
Figure 7:
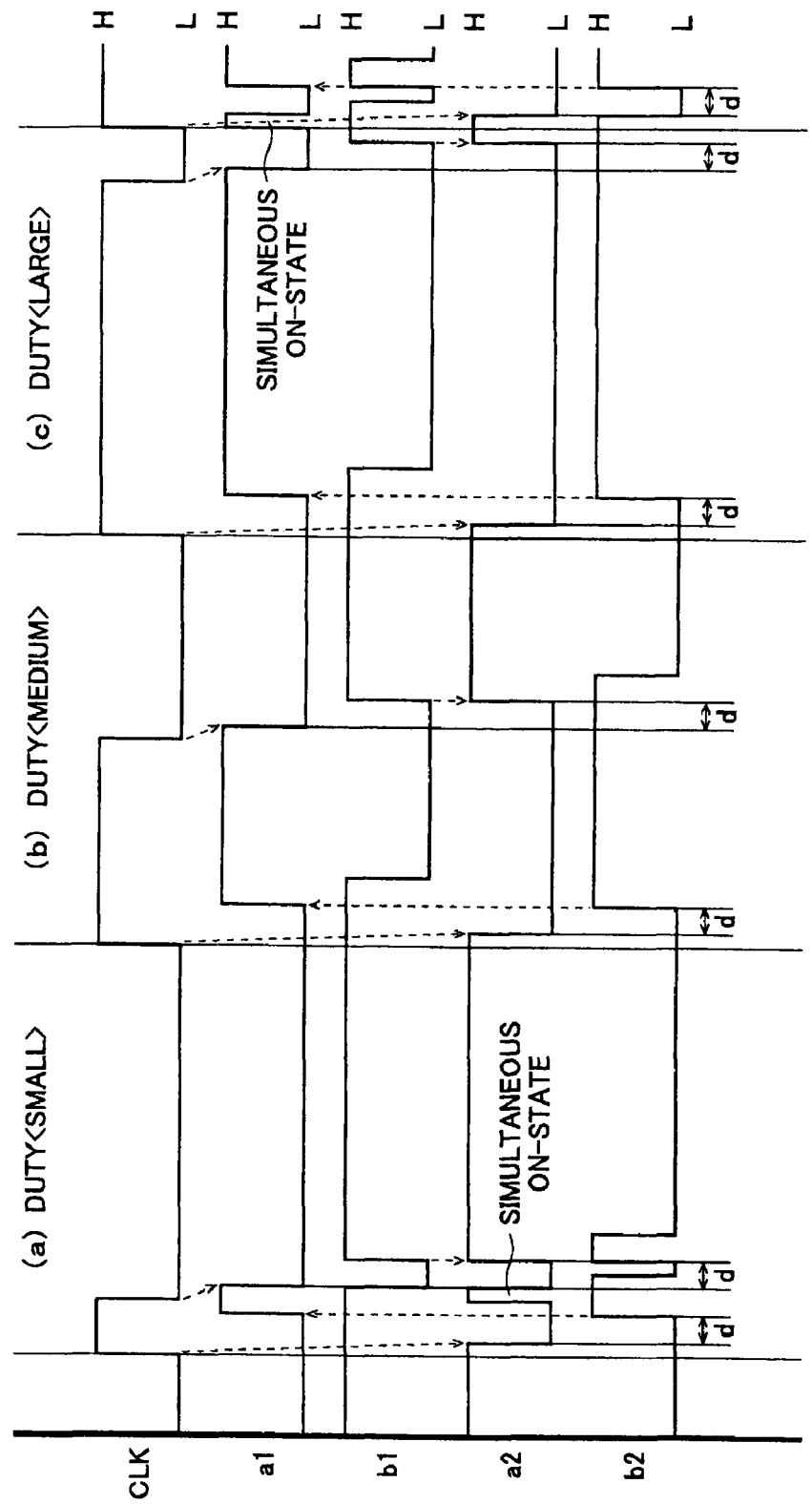
FIG. 7 is a timing chart for illustrating a conventional switching driving.

Unlike with the conventional configuration shown in FIG. 6, according to the above-described logic, even in a case where the duty of the drive signal CLK is reduced as shown in (a) of the figure and a period during which the drive signal CLK is low level (L) and the monitor signal B1 is high level (H) is caused to arise by an inevitable signal delay occurring in a circuit in a high-level period of the gate signal A1 (that is, an on-period of the transistor 31), the gate signal A2 is never unintendedly shifted to high level (H).

Likewise, according to the above-described logic, even in a case where the duty of the drive signal CLK is increased as shown in (c) of the figure, and a period during which the drive signal CLK is high level (H) and the monitor signal B2 is high level (H) is caused to arise by an inevitable signal delay occurring in a circuit in a high-level period of the gate signal A2 (that is, in an on-period of the transistor 32), the gate signal A1 is never unintendedly shifted to high level (H).

As described above, the switching regulator of this embodiment is provided with the switch driver circuit 2 for driving the transistors 31 and 32 that are connected in series between two different potentials, and the switch driver circuit 2 includes: the upper monitor unit 23 for monitoring the gate signal A1 of the transistor 31 to generate the monitor signal B1 that indicates the on/off state of the transistor 31; the lower monitor unit 27 for monitoring the gate signal A2 of the transistor 32 to generate the monitor signal B2 that indicates the on/off state of the transistor 32; the upper control unit 21 for generating the gate signal A1 according to the predetermined drive signal CLK and the monitor signal B2; and the lower control unit 25 for generating the gate signal A2 according to the drive signal CLK and the monitor signal B1. The upper control unit 21 shifts the logic of the gate signal A1 so as to latch the first switch device off, using, as a trigger, reception of an instruction to turn off the transistor 31 given according to the drive signal CLK, and so as to release latched-off state of the transistor 31, using, as a trigger, recognition of the transistor 32 having been turned off obtained according to the monitor signal B2. The lower control unit 25 shifts the logic of the gate signal A2 so as to latch the transistor 32 off, using, as a trigger, reception of an instruction to turn off the transistor 32 given according to the drive signal CLK, and so as to release latched-off state of the transistor 32, using, as a trigger, recognition of the transistor 31 having been turned off obtained according to the monitor signal B1.

With this configuration, the transistors 31 and 32 can be securely prevented from being simultaneously turned on under any conditions including, for example, a case where the switching frequencies of the transistors 31 and 32 are increased, and this makes it possible to avoid damage to the devices caused by a flow-through current and degradation of efficiency, and thus to improve reliability of a set that incorporates the switching regulator.

Next, with reference to FIG. 8, a detailed description will be given of a terminal abnormality protection circuit that performs a predetermined terminal abnormality protection operation when an abnormality of the threshold voltage Vth1 (overcurrent protection value) is detected.

Figure 8:
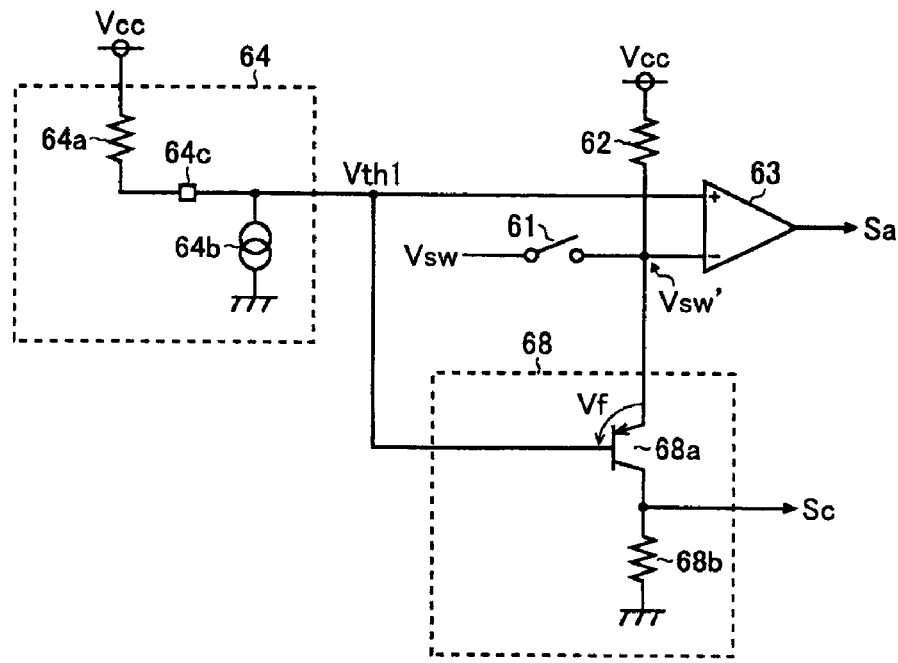
FIG. 8 is a circuit diagram showing an example of a configuration of a terminal abnormality protection circuit 68.

FIG. 8 is a circuit diagram showing an example of a configuration of a terminal abnormality protection circuit 68.

As shown in FIG. 8, the above-mentioned direct current voltage supply 64 is configured such that a terminal voltage (having a voltage level V=Vcc−I×R) which is to be drawn as the threshold voltage Vth1 is obtained at an external terminal 64c by making a constant current (having a current value I) generated at a constant current supply 64b flow through an external resistor 64a (having a resistance value R) whose first terminal is connected to the power supply voltage Vcc application terminal and whose second terminal is connected to the external terminal 64c. This configuration allows the user to easily adjust the threshold voltage Vth1, which is the overcurrent protection value, by replacing the resistor 64a as necessary, and thus gives the user a higher degree of freedom in setting.

On the other hand, the terminal abnormality protection circuit 68 is means for stopping the switching driving of the transistor 31 when it finds the threshold voltage Vth1 to be out of a predetermined limit range, and includes a pnp-type bipolar transistor 68a and a resistor 68b.

An emitter of the transistor 68a is connected to a switch voltage Vsw' application terminal to which the switch voltage Vsw' is applied, that is, the inverting input terminal (−) of the comparator 63. A base of the transistor 68a is connected to a threshold voltage Vth1 application terminal to which the threshold voltage Vth1 is applied, that is, the non-inverting input terminal (+) of the comparator 63. A collector of the transistor 68a is connected to a ground terminal via a resistor 68b, and a terminal abnormality protection signal Sc is drawn from the collector.

In the terminal abnormality protection circuit 68 having the above-described configuration, the transistor 68a is turned on only when the threshold voltage Vth1 applied to its base is reduced below the switch voltage Vsw' applied to its emitter by a value of 1 Vf. For example, in a case where the resistor 64a has come off and thus the external terminal 64c is in an open state, or in a case where the external terminal 64c is short-circuited to the ground, the threshold voltage Vth1 falls to a ground voltage (or a voltage in the vicinity of the ground voltage), and thus the transistor 68a is turned on. At this time, the terminal abnormality protection signal Sc is shifted from low level (a logic that indicates a normal state) to high level (a logic that indicates an abnormal state).

Thus, by configuring the terminal abnormality protection circuit 68 such that the threshold voltage Vth1 is found to be out of the predetermined limit range and the predetermined terminal abnormality protection operation (such as a control to stop the output) is performed when the terminal abnormality protection signal Sc is turned to high level, it is possible to avoid a worst case where an overcurrent continues to flow to destroy an IC and peripheral components as a result of relying on the overcurrent protection function that cannot operate normally.

Incidentally, the terminal abnormality protection operation may be, for example, such that the terminal abnormality protection signal Sc is inputted to the above-mentioned timer latch circuit 67, and the transistor 31 is latched off when an abnormal state of the threshold voltage Vth1 has continued over a predetermined time period.

On the other hand, the overcurrent protection function cannot operate normally also in a case where the resistor 64a is short circuited to cause the external terminal 64c to be short-circuited to the power supply; in this case, however, since the first comparison signal Sa of the comparator 63 is fixed to high level (that is, a logic that indicates an overcurrent state) and thus the output operation is stopped, an IC and peripheral components are protected from damage.

As described above, the switching regulator of this embodiment includes: overcurrent protection circuits (61 to 64) performing the overcurrent protection operations according to the threshold voltage Vth1 (the overcurrent protection value) set by the external resistor 64a; and the terminal abnormality protection circuit 68 that performs the predetermined terminal abnormality protection operation when an abnormality of the threshold voltage Vth1 is detected. With this configuration, not only when an overcurrent has occurred but also when an abnormality of the threshold voltage Vth1 has resulted from the external terminal 64c being short-circuited to the ground or to the power supply, the resistor 64a being short-circuited or coming off, adhesion of dust or the like to the resistor 64a, or incorrect attachment of the resistor 64a, an IC and peripheral components can be prevented from being destroyed, and this makes it possible to improve reliability of a set that incorporates the switching regulator.

Also, in the switching regulator of this embodiment, the terminal abnormality protection circuit 68 includes the pnp-type bipolar transistor 68a whose base is connected to the threshold voltage Vth1 application terminal, whose emitter is connected to the switch voltage Vsw' application terminal, and from whose collector the terminal abnormality protection signal Sc is drawn. With this configuration, the terminal abnormality protection circuit 68 is achieved quite easily, and this makes it possible to minimize increases in number of devices and in circuit scale, and thus to minimize cost increase associated therewith.

Figure 9:
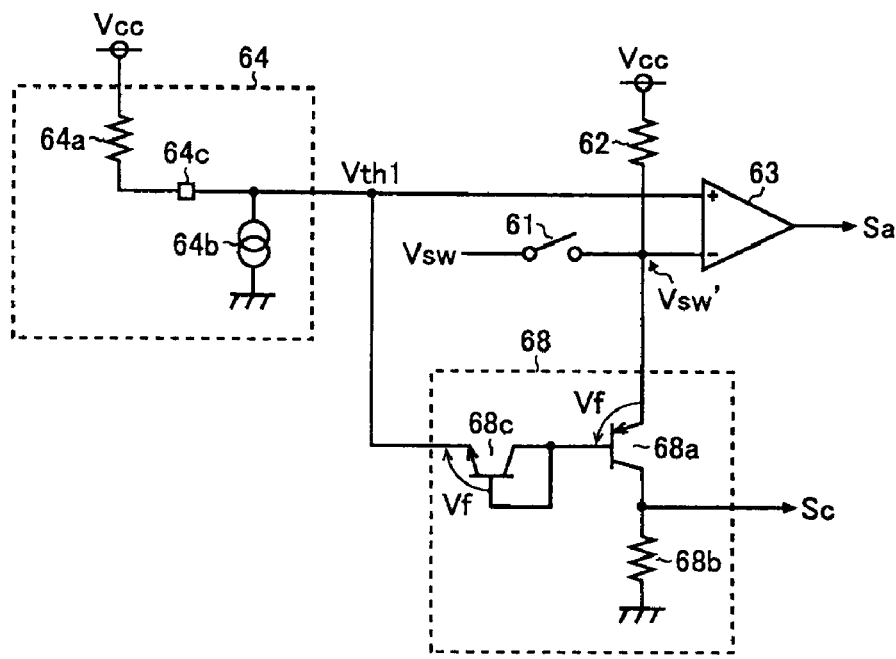
FIG. 9 is a circuit diagram showing an example of the configuration of the terminal abnormality protection circuit 68.

Incidentally, in the switching regulator of this embodiment, in a case where, for example, the power supply voltage Vcc is 1 V and the threshold voltage Vth1 is set to 0.1 V, a voltage difference between the switch voltage Vsw' and the threshold voltage Vth1 in normal operation is up to 0.9 V. Thus, in view of ensuring normal operation of the overcurrent protection function of the terminal abnormality protection circuit 68, it is preferable that the transistor 68a be designed to have an on-threshold voltage Vf that is higher than 0.9 V such that the transistor 68a is turned on only when a voltage difference that is higher than 0.9 V arises between the base and the emitter thereof, or it is preferable that a diode (in FIG. 9, a diode-connected npn-type bipolar transistor 68c) an anode of which is connected to the base of the transistor 68a and a cathode of which is connected to the threshold voltage Vth1 application terminal be inserted as shown in FIG. 9 such that a total of the on-threshold voltage Vf of the transistor 68a and an on-threshold voltage Vf of the transistor 68c is higher than 0.9 V.

Figure 10:
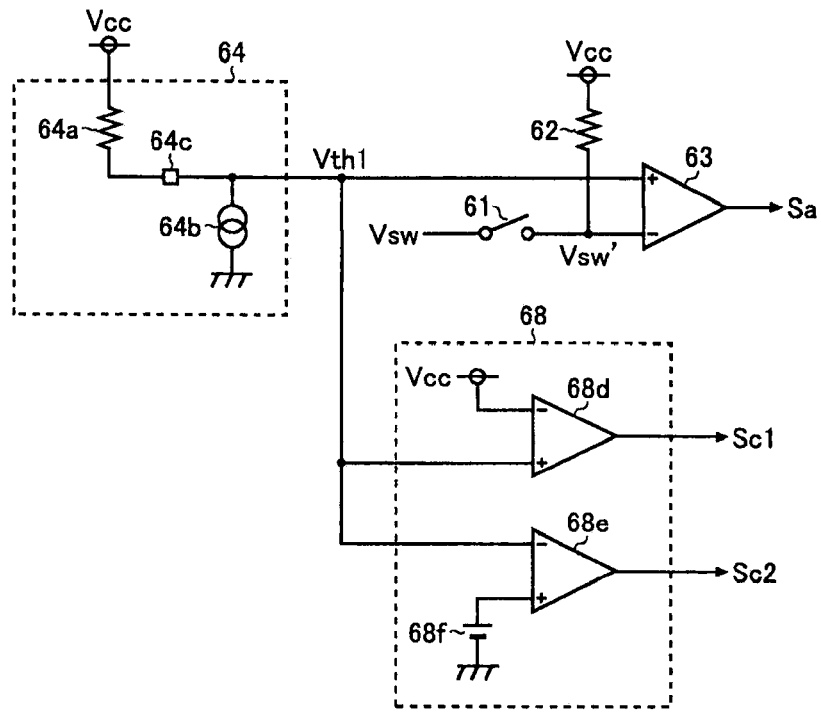
FIG. 10 is a circuit diagram showing an example of the configuration of the terminal abnormality protection circuit 68.

Also, in the switching regulator of this embodiment, the configuration of the terminal abnormality protection circuit 68 is not limited to the one described above, and, as shown in FIG. 10, the terminal abnormality protection circuit 68 may be provided with a comparator 68d that compares the threshold voltage Vth1 with a predetermined threshold value (the power supply voltage Vcc) to output a comparison result as a terminal abnormality protection signal Sc1 and a comparator 68e that compares the threshold voltage Vth1 with a predetermined threshold value (a positive terminal voltage of a direct current voltage supply 68f) to output a comparison result as a terminal abnormality protection signal Sc2. With this configuration, an abnormality of the threshold voltage Vth1 resulting from the external terminal 64c being short-circuited to the ground or to the power supply, the resistor 64a being short-circuited or coming off, dust or the like adhering to the resistor 64a, or incorrect attachment of the resistor 64a can be properly detected, and thus an IC and peripheral components can be protected from destruction.

Next, with reference to FIG. 11, detailed descriptions will be given of the oscillation circuit 14 and an oscillation abnormality protection circuit that performs a predetermined oscillation abnormality protection operation when an abnormality of an oscillation frequency of the oscillation circuit 14 is detected.

Figure 11:
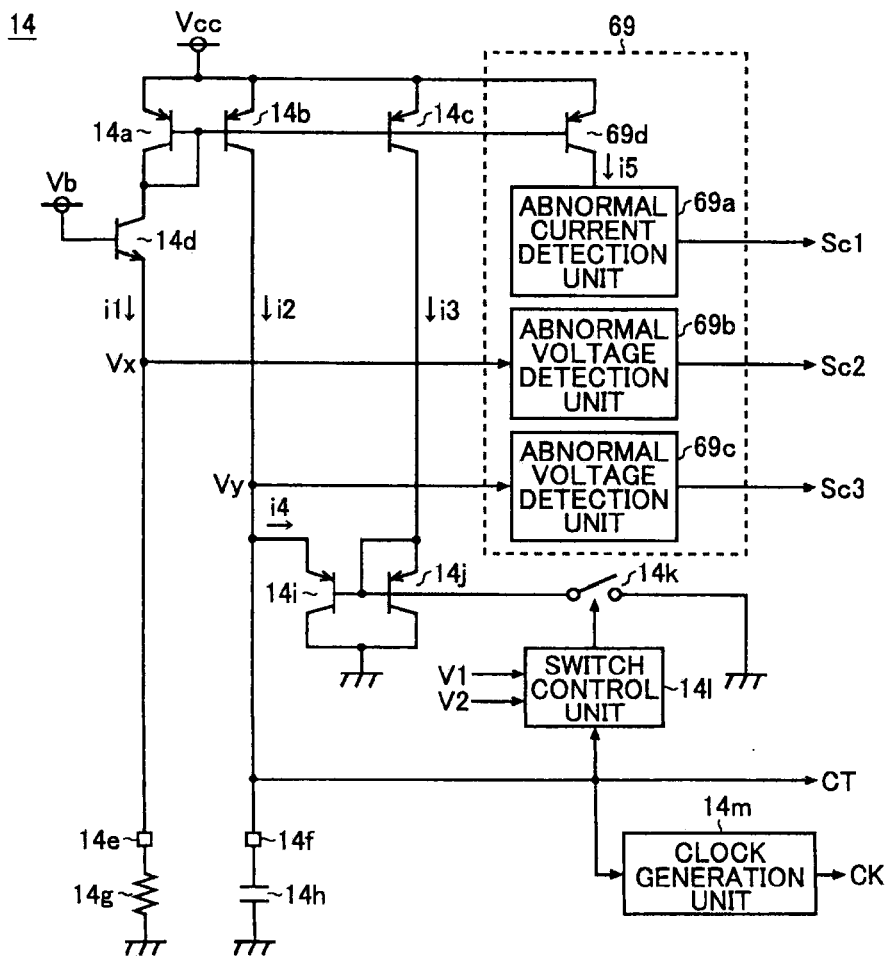
FIG. 11 is a circuit diagram showing examples of configurations of an oscillation circuit 14 and an oscillation abnormality protection circuit 69.

FIG. 11 is a circuit diagram showing examples of configurations of the oscillation circuit 14 and the oscillation abnormality protection circuit 69.

First, the configuration and the operation of the oscillation circuit 14 will be described.

As shown in FIG. 11, the oscillation circuit 14 of this example includes: pnp-type bipolar transistors 14a, 14b, and 14c; an npn-type bipolar transistor 14d; external terminals 14e and 14f; an external resistor 14g; an external capacitor 14h; pnp-type bipolar transistors 14i and 14j; a switch 14k; a switch control unit 14l; and a clock signal generation unit 14m.

Emitters of the transistors 14a, 14b, and 14c are connected to a power supply voltage Vcc application terminal. Bases of the transistors 14a, 14b, and 14c are connected to a collector of the transistor 14a. A collector of the transistor 14d is connected to the collector of the transistor 14a. A base of the transistor 14d is connected to a base voltage Vb application terminal to which the base voltage Vb is applied. An emitter of the transistor 14d is connected to the external terminal 14e. A collector of the transistor 14b is connected to the external terminal 14f.

The external terminal 14e is a terminal to which is externally connected the resistor 14g (having a resistance value R) for setting an oscillation frequency, and is connected to a ground terminal via the resistor 14g. The external terminal 14f is a terminal to which is externally connected the capacitor 14h (having a capacitance value C) for setting an oscillation frequency, and is connected to a ground terminal via the capacitor 14h. The provision of the external terminals 14e and 14f allows the use to freely set the oscillation frequency of the oscillation circuit 14 by selecting, as necessary, the external resistor 14g and the external capacitor 14h.

An emitter of the transistor 14i is connected to the collector of the transistor 14b. An emitter of the transistor 14j is connected to the collector of the transistor 14c. Collectors of the transistors 14i and 14j are connected to a ground terminal. Bases of the transistors 14i and 14j are connected to the emitter of the transistor 14j. A first end of the switch 14k is connected to the bases of transistors 14i and 14j. A second end of the switch 14k is connected to a ground terminal.

The switch control unit 14l is means for comparing a terminal voltage Vy (which corresponds to the triangular waveform signal CT) of the capacitor 14h with a predetermined maximum voltage V1 and with a predetermined minimum voltage V2 to control the opening/closing of the switch 14k.

The clock signal generation unit 14m is means for generating, from the terminal voltage Vy (the triangular waveform signal CT) of the capacitor 14h, the clock signal CK in a pulse state having a same frequency as the terminal voltage Vy.

In the oscillation circuit 14 configured as described above, the transistors 14a, 14b, and 14c form a first current mirror, and the transistors 14i and 14j form a second current mirror. The mirror ratios of the first and second current mirrors can be set to any ratio, but the description given below deals with a case where the mirror ratio in the first current mirror is 1 and that in the first current mirror is 2.

In the case where the mirror ratios are set as just mentioned, mirror currents i2 and i3 having a same current value as a standard current i1 that flows through the transistor 14a are allowed to flow through the transistors 14b and 14c, respectively, in the first current mirror; and the second mirror, a mirror current i4 having a current value twice as large as a current value of the current i3 that flows through the transistor 14j (thus twice as large as the current i1 or i2) is allowed to flow through the transistor 14i. However, when the switch 14k is turned on, the second current mirror does not function, and thus the current value of the mirror current i1 is zero.

When the switch 14k is turned on, the capacitor 14h is charged by the mirror current i2, and the terminal voltage Vy rises. When the terminal voltage Vy rises to reach the maximum voltage V1, the switch control unit 14l turns off the switch 14k. With such switch control, the mirror current i4 is drawn into the second current mirror. Here, since the current value of the mirror current i4 is twice as large as that of the mirror current i2, the capacitor 14h is discharged by a difference current between the mirror currents i4 and i2 (that is, i4−i2), and the terminal voltage Vy starts falling. Then, when the terminal voltage Vy falls to reach the minimum voltage V2, the switch control unit 14l turns on the switch 14k. With such switch control, as has just been described, the capacitor 14h is charged by the mirror current i2, and the terminal voltage Vy starts rising again. Through repetition of such charging and discharging, the triangular waveform signal CT and the clock signal CK having a desired oscillation frequency are generated.

As is apparent from the above description, the oscillation frequency of the oscillation circuit 14 corresponds to a charging/discharging period that the terminal voltage Vy takes to rise from the minimum voltage V2 to the maximum voltage V1 and then fall to the minimum voltage V2 again. If the maximum voltage V1 and the minimum voltage V2 that are inputted to the switch control unit 14l are fixedly set, the charging/discharging period is determined according to a current value of a charging/discharging current (that is, the current value of the standard current i1, and thus the resistance value R of the resistor 14g) and the capacitance value C of the capacitor 14h. Thus, the oscillation frequency of the oscillation circuit 14 of this example can be freely adjusted by selecting the resistance value R of the resistor 14g and the capacitance value C of the capacitor 14h as necessary.

Incidentally, the transistor 14d, which is provided at an input side of the first current mirror, is means for applying to the external terminal 14e a certain level of bias voltage corresponding to the base voltage Vb. As to the base voltage Vb of the transistor 14d, the power supply voltage Vcc or a divided voltage thereof may be used as it is as the base voltage Vb, or the divided voltage may be used as the base voltage Vb after being buffered to enhance voltage accuracy thereof. Or, the base voltage Vb may be controlled to be highly accurate by feeding back a terminal voltage Vx of the external terminal 14e. In either case, as long as the terminal voltage Vx of the external terminal 14e is determined in advance by using the transistor 14d, the resistor R to be selected can be easily calculated according to a simple formula describing Ohm's law: i1=Vx/R. This helps achieve improved user-friendliness of the oscillation circuit 14.

Next, the configuration and the operation of the oscillation abnormality protection circuit 69 will be described.

As shown in FIG. 11, the oscillation abnormality protection circuit 69 of this example includes an abnormal current detection unit 69a, a first abnormal voltage detection unit 69b, a second abnormal voltage detection unit 69c, and a pnp-type bipolar transistor 69d.

An emitter of the transistor 69d is connected to the power supply voltage Vcc application terminal. A base of the transistor 69d is connected to the bases of the transistors 14a, 14b, and 14c. That is, the transistor 69d is means for generating, in parallel with the first current mirror described above, a monitor current i5 corresponding to the standard current i1 that flows through the transistor 14a, and feeding the monitor current i5 from a collector thereof to the abnormal current detection unit 69a.

The abnormal current detection unit 69a monitors the monitor current i5, and, when it finds the monitor current i5 to be out of a predetermined limit range, shifts an oscillation abnormality protection signal Sc1 from low level (a logic that indicates a normal state) to high level (a logic that indicates an abnormal state) so as to stop the switching driving of the transistor 31.

The abnormal voltage detection unit 69b monitors the terminal voltage Vx, and, when it finds the terminal voltage Vx to be out of a predetermined limit range, shifts an oscillation abnormality protection signal Sc2 from low level (a logic that indicates a normal state) to high level (a logic that indicates an abnormal state) so as to stop the switching driving of the transistor 31.

The abnormal voltage detection unit 69c monitors the terminal voltage Vy, and, when it finds the terminal voltage Vy to be out of a predetermined limit range, shifts an oscillation abnormality protection signal Sc3 from low level (a logic that indicates a normal state) to high level (a logic that indicates an abnormal state) so as to stop the switching driving of the transistor 31.

In a case where, for example, the resistor 14g is short-circuited and thus the external terminal 14e is short-circuited to the ground, the standard current i1 (and thus the monitor current i5) increases, and the terminal voltage Vx falls to reach a ground voltage (or a voltage in the vicinity of the ground voltage). On the other hand, in a case where the resistor 14g has come off and thus the external terminal 14e is in an open state, or in a case where the external terminal 14e is short-circuited to the power supply, the standard current i1 (and thus the monitor current i5) decreases, and the terminal voltage Vx rises to reach the power supply voltage Vcc (or a voltage in the vicinity of the power supply voltage Vcc).

Also, in a case where the capacitor 14h is short-circuited and thus the external terminal 14f is short-circuited to the ground, the terminal voltage Vy falls to reach a ground voltage (or a voltage in the vicinity of the ground voltage). On the other hand, in a case where the capacitor 14h has come off and thus the external terminal 14f is in an open state, or in a case where the external terminal 14f is short-circuited to the power supply, the terminal voltage Vy rises to reach the power supply voltage Vcc (or a voltage in the vicinity of the power supply voltage Vcc).

Thus, at the abnormal current detection unit 69a and the abnormal voltage detection units 69b and 69c, with attention paid to the just-described behaviors of the monitor current i5 and the terminal voltages Vx and Vy, respectively, the oscillation abnormality protection signals Sc1, Sc2, and Sc3, respectively, are generated, the oscillation abnormality protection signals Sc1, Sc2, and Sc3 indicating whether or not an abnormalities has occurred in the external terminals 14e and 14f, and thus whether or not an abnormality has occurred in the oscillation frequency of the oscillation circuit 14.

Thus, with a configuration where the oscillation frequency is judged to be out of a predetermined limit range when any one of the oscillation abnormality protection signals Sc1, Sc2, and Sc3 becomes high level, and a predetermined oscillation protection operation (such as output stopping control)

is performed, it is possible to avoid a case where an IC and peripheral components are destroyed by an unintended oscillation.

Incidentally, the oscillation abnormality protection operation may be, for example, such that the oscillation abnormality protection signals Sc1, Sc2, and Sc3 are inputted to the above-mentioned timer latch circuit 67, and the transistor 31 is latched off when an abnormal state of the oscillation frequency has continued over a predetermined time period.

As described above, the switching regulator of this embodiment includes: the oscillation circuit 14 whose oscillation frequency is set by the external resistor 14g and the external capacitor 14h; and the oscillation abnormality protection circuit 69 that performs the predetermined oscillation abnormality protection operation when an abnormality of the oscillation frequency is detected. With this configuration, an IC and peripheral components can be protected from destruction even when an abnormality of the oscillation frequency of the oscillation circuit 14 has resulted from the external terminals 14e and 14f being short-circuited to the ground or to the power supply, the resistor 14g and the capacitor 14h being short-circuited or coming off, dust or the like adhering to the resistor 14g and the capacitor 14h, or incorrect attachment of the resistor 14g and the capacitor 14h; thus, reliability of a set incorporating the switching regulator can be improved.

Also, in the switching regulator of this embodiment, the oscillation circuit 14 includes the resistor 14g and the capacitor 14h as external devices, charges and discharges the capacitor 14h by using the standard current i1 (more specifically, the mirror currents i2 and i4) that is generated by applying a predetermined voltage to a first terminal of the resistor 14g, and generates the triangular waveform signal CT and the clock signal CK from the terminal voltage Vy of the capacitor 14h; and the oscillation abnormality protection circuit 69 monitors the standard current i1 (specifically, its mirror current i5), the terminal voltage Vx of the resistor 14g, and the terminal voltage Vy of the capacitor 14h, and according to the monitor result, generates the oscillation abnormality protection signals Sc1, Sc2, and Sc3. This configuration makes it possible to detect an abnormality of the oscillation frequency with simple detection means.

Next, a description will be given of the configuration and the operation of the abnormal current detection unit 69a with reference to FIGS. 12A and 12B.

Figure 12A:
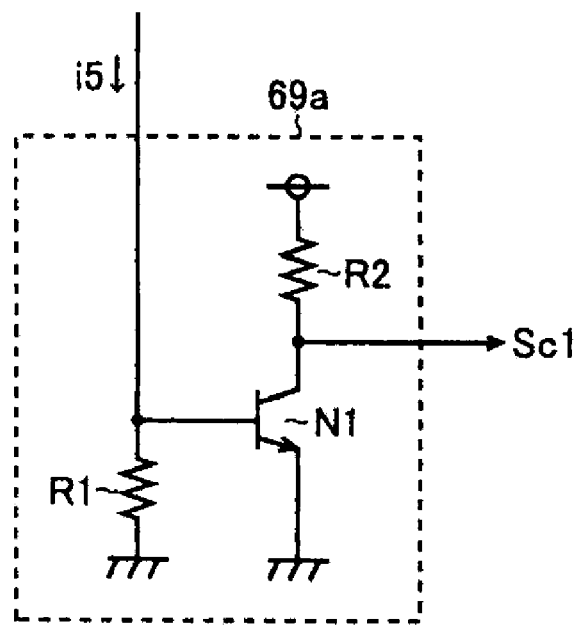
Figure 12B:
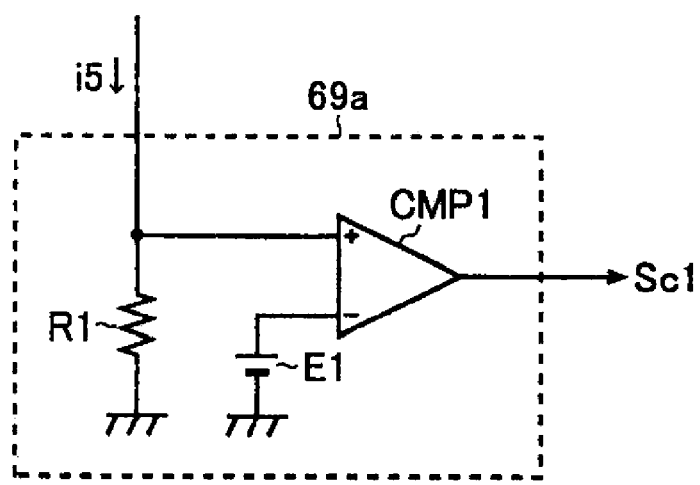

FIGS. 12A and 12B are each a circuit diagram showing an example of the configuration of the abnormal current detection unit 69a.

The example of the abnormal current detection unit 69a shown in FIG. 12A includes an npn-type bipolar transistor N1 and resistors R1 and R2. A base of the transistor N1 is connected to a monitor current i5 input terminal and is also connected to a ground terminal via the resistor R1. A collector of the transistor N1 is connected, via the resistor R2, to a power supply voltage Vcc application terminal. Incidentally, the collector of the transistor N1 corresponds to an oscillation abnormality protection signal Sc1 output terminal. An emitter of the transistor N1 is connected to a ground terminal.

In the abnormal current detection unit 69a configured as described above, the monitor current i5 is converted into a base voltage of the transistor N1, according to which the transistor N1 is turned on/off, and thereby the abnormality protection signal Sc1 is generated.

The example of the abnormal current detection unit 69a shown in FIG. 12B includes a comparator CMP1, a direct current power supply E1, and a resistor R1. A non-inverting input terminal (+) of the comparator CMP1 is connected to a monitor current i5 input terminal, and is also connected to a ground terminal via the resistor R1. An inverting input terminal (−) of the comparator CMP1 is connected to a positive terminal (to which a threshold voltage is applied) of the direct current voltage supply E1. A negative terminal of the direct current voltage supply E1 is connected to a ground terminal. An output terminal of the comparator CMP1 corresponds to an oscillation abnormality protection signal Sc1 output terminal.

In the abnormal current detection unit 69a configured as described above, the monitor current i5 is converted into an input voltage of the comparator CMP1 by use of the resistor R1, and a comparison result between the input voltage of the comparator CMP1 and a predetermined threshold voltage is outputted as the oscillation abnormality protection signal Sc1.

Incidentally, a constant current supply may be used instead of the above-mentioned resistor R1.

Next, a description will be given of the configuration and the operation of the abnormal voltage detection unit 69b with reference to FIGS. 13A and 13B.

Figure 13A:
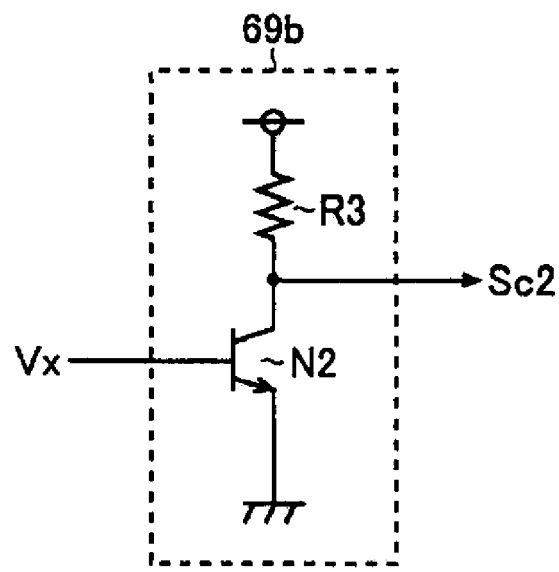
FIG. 13A is a circuit diagram showing an example of a configuration of an abnormal voltage detection unit 68b.
Figure 13B:
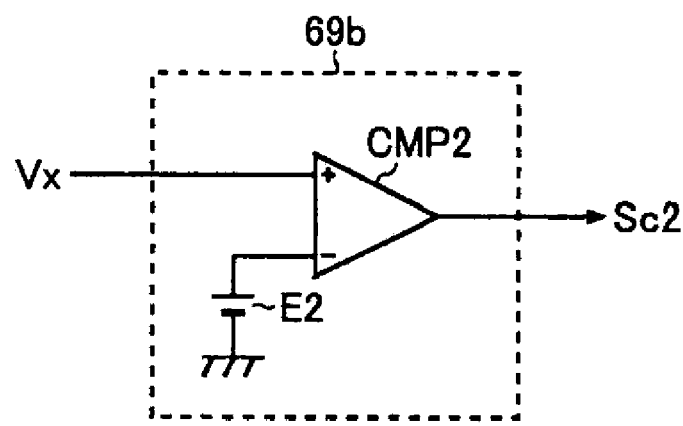
FIG. 13B is a circuit diagram showing another example of the configuration of the abnormal current detection unit 68b.

FIGS. 13A and 13B are each a circuit diagram showing an example of the configuration of the abnormal voltage detection unit 69b. Incidentally, the abnormal voltage detection unit 69c has a same configuration as the abnormal voltage detection unit 69b, and thus overlapping descriptions thereof will be omitted.

The example of the abnormal voltage detection unit 68b shown in FIG. 13A includes an npn-type bipolar transistor N2 and a resistor R3. A base of the transistor N2 is connected to a terminal voltage Vx application terminal to which the terminal voltage Vx is applied. A collector of the transistor N2 is connected to a power supply voltage Vcc application terminal via the resistor R3. The collector of the transistor N2 corresponds to an oscillation abnormality protection signal Sc2 output terminal. An emitter of the transistor N2 is connected to a ground terminal.

In the abnormal voltage detection unit 69b configured as described above, the terminal voltage Vx is applied to the transistor N2 as a base voltage, according to which the transistor N2 is turned on/off, and thereby the abnormal protection signal Sc2 is generated.

The example of the abnormal voltage detection unit 69b shown in FIG. 13B includes a comparator CMP2 and a direct current voltage supply E2. A non-inverting input terminal (+) of the comparator CMP2 is connected to a terminal to which the terminal voltage Vx is applied. An inverting terminal (−) of the comparator CMP2 is connected to a positive terminal (to which a threshold voltage is applied) of the direct current voltage supply E2. A negative terminal of the direct current voltage supply E2 is connected to a ground terminal. An output terminal of the comparator CMP2 corresponds to an oscillation abnormality protection signal Sc2 output terminal.

In the abnormal voltage detection unit 69b configured as described above, a comparison result between the terminal voltage Vx and a predetermined threshold voltage is outputted as the oscillation abnormality detection signal Sc2.

Incidentally, in the embodiment described above, a configuration is dealt with where the present invention is applied to a step-down switching regulator; however, this is not meant to limit the application of the present invention to such an embodiment, and in practice, the present invention finds a wide application in electronic circuits provided with a switch driver circuit, such as switching regulators, charge pumps, and driver ICs.

Also, the present invention may be practiced with various modifications made otherwise than specifically described above within the spirit of the invention.

For example, in the embodiment described above, a configuration is dealt with where NAND-type RS flip-flops are used as the upper control unit 21 and the lower control unit 25, but the configuration of the present invention is not limited to this configuration, and, for example, NOR-type RS flip-flops may be used to achieve the same operation.

Also, in the embodiment described above, a configuration is dealt with where a resistor is connected as an external device for setting an overcurrent protection value; however, this is not meant to limit the configuration of the present invention to this configuration, and a different external device may be connected.

Also, in the embodiment described above, a configuration is dealt with where a resistor and a capacitor are connected as external components for setting an oscillation frequency; however this is not meant to limit the configuration of the present invention to this configuration, and a different external device may be connected.

Also, in the embodiment described above, P-channel field effect transistors may be used instead of the pnp-type bipolar transistors, and N-channel field effect transistors may be used instead of the npn-type bipolar transistors.

INDUSTRIAL APPLICABILITY

The present invention offers an art that is useful in achieving a simultaneous ON-state prevention function of electronic circuits provided with a switch driver circuit, such as switching regulators, charge pumps, and driver ICs.

What is claimed is:

1. An electronic circuit, comprising:
a switch driver circuit for driving a first switch device and a second switch device connected in series between two different potentials, wherein
the switch driver circuit comprises:
a first monitor unit for monitoring a first control signal fed to the first switch device to generate a first monitor signal that indicates an on/off state of the first switch device;
a second monitor unit for monitoring a second control signal fed to the second switch device to generate a second monitor signal that indicates an on/off state of the second switch device;
a first control unit for generating the first control signal according to a predetermined drive signal and the second monitor signal; and
a second control unit for generating the second control signal according to the drive signal and the first monitor signal,
the first control unit shifts a logic of the first control signal so as to latch the first switch device off, using, as a trigger, reception of an instruction to turn off the first switch device given according to the drive signal, and so as to release a latched-off state of the first switch device using, as a trigger, recognition of the second switch device having been turned off obtained according to the second monitor signal, and
the second control unit shifts a logic of the second control signal so as to latch off the second switch device using, as a trigger, reception of an instruction to turn off the second switch device given according to the drive signal, and so as to release latched-off state of the second switch device, using, as a trigger, recognition of the first switch device having been turned off obtained according to the first monitor signal, wherein the first control unit includes:
a first inverter of which an input terminal is connected to a second monitor signal application terminal to which the second monitor signal is applied,
a first AND operator of which a first input terminal is connected to the second monitor signal application terminal and a second input terminal is connected to a drive signal application terminal to which the drive signal is applied,
a first NAND operator of which a first input terminal is connected to the drive signal application terminal,
a second NAND operator of which a first input terminal is connected to an output terminal of the first NAND operator, a second input terminal is connected to an output terminal of the first inverter, and an output terminal is connected to a second input terminal of the first NAND operator, and
a second AND operator of which a first input terminal is connected to an output terminal of the first AND operator, a second input terminal is connected to the output terminal of the second NAND operator, and an output terminal is connected to a control terminal of the first switch device via a first driver unit, and wherein the second control unit includes:
a second inverter of which a input terminal is connected to a first monitor signal application terminal to which the first monitor signal is applied,
a third NAND operator of which a first input terminal is connected to a inverted drive signal application terminal to which the drive signal is invertedly applied,
a fourth NAND operator of which a first input terminal is connected to an output terminal of the third NAND operator, a second input terminal is connected to an output terminal of the second inverter, and an output terminal is connected to a second input terminal of the third NAND operator,
a fifth NAND operator of which a first input terminal is connected to the inverted drive signal application terminal and a second input terminal is connected to the first monitor signal application terminal, and
a NOR operator of which a first input terminal is connected to the output terminal of the third NAND operator, a second input terminal is connected to an output terminal of the fifth NAND operator, and an output terminal is connected to a control terminal of the second switch device via a second driver unit.

2. The electronic circuit of claim 1, further comprising: an abnormality protection circuit that includes:
a comparator that compares a switch voltage obtained at a connection node between the first and second switch devices and a predetermined threshold voltage when the first switch device is in an on-state; and
a timer latch circuit that judges, according to a comparison signal from the comparator, whether or not a current flowing through the first switch device is in an overcurrent state, and latches the first switch device off when the overcurrent state has continued for a predetermined time period.

3. The electronic circuit of claim 2, wherein the abnormality protection circuit turns off the first switch device at a time point when the comparison signal from the comparator indicates the overcurrent state.

4. The electronic circuit of claim 3, wherein
the abnormality protection circuit includes a second comparator that compares an output voltage obtained by smoothing the switch voltage and a predetermined threshold voltage, and the timer latch circuit judges, according to a comparison signal from the second comparator, whether or not the output voltage is in a reduced-voltage state, and latches the first switch device off when the reduced-voltage state has continued for a predetermined time period.

5. The electronic circuit of claim 1, further comprising:
an overcurrent protection circuit that performs an overcurrent protection operation according to an overcurrent protection value set by an external device; and
a terminal abnormality protection circuit that performs a predetermined terminal abnormality protection operation when an abnormality of the overcurrent protection value is detected, wherein
when the first switch device is in an on-state, the overcurrent protection circuit stops switching-driving of the first switch device if it is judged that a current flowing through the first switch device is in an overcurrent state according to a comparison result between a switch voltage obtained at a connection node of the first and second switch devices and the overcurrent protection value, and
the terminal abnormality protection circuit stops switching-driving of the first switch device if it is judged that the overcurrent protection value is out of a predetermined limit range.

6. The electronic circuit of claim 5, wherein the terminal abnormality protection circuit includes a pnp-type bipolar transistor a base of which is connected to a terminal to which the overcurrent protection value is applied, an emitter of which is connected to a terminal to which is applied a switch voltage that is obtained when the first switch device is in an on-state, and from a collector of which a terminal abnormality protection signal is extracted.

7. The electronic circuit of claim 6, wherein the terminal abnormality protection circuit includes a diode or a diode-connected transistor, an anode of which is connected to the base of the pnp-type bipolar transistor and a cathode of which is connected to the terminal to which the overcurrent protection value is applied.

8. The electronic circuit of claim 5, wherein the terminal abnormality protection circuit includes a comparator that compares the overcurrent protection value and a predetermined threshold value, and outputs a comparison result as a terminal abnormality protection signal.

9. The electronic circuit of claim 6, further comprising:
a timer latch circuit that judges whether or not the overcurrent protection value is in an abnormal state according to the terminal abnormality protection signal, and latches the first switch device off when the abnormal state has continued over a predetermined time period.

10. The electronic circuit of claim 8, further comprising:
a timer latch circuit that judges whether or not the overcurrent protection value is in an abnormal state according to the terminal abnormality protection signal, and latches the first switch device off when the abnormal state has continued over a predetermined time period.

11. The electronic circuit of claim 1, further comprising:
an oscillation circuit an oscillation frequency of which is set by an external device; and
an oscillation abnormality protection circuit that performs a predetermined oscillation abnormality protection operation when an abnormality of the oscillation frequency is detected, wherein
switching frequencies of the first and second switch devices are set by an oscillation frequency of the oscillation circuit, and the oscillation abnormality protection circuit stops switching driving of the first switch device when the oscillation frequency is out of a predetermined limit range.

12. The electronic circuit of claim 11, wherein
the oscillation circuit includes a resistor and a capacitor each as the external device, charges and discharges the capacitor by using a standard current generated by applying a predetermined voltage to a first terminal of the resistor, and outputs a terminal voltage of the capacitor as an oscillation signal, and
the oscillation abnormality protection circuit monitors at least one of the standard current, a terminal voltage of the resistor, and the terminal voltage of the capacitor, and generates an oscillation abnormality protection signal according to a monitor result.

13. The electronic circuit of claim 12, further comprising:
a timer latch circuit that judges whether or not the overcurrent protection value is in an abnormal state according to the terminal abnormality protection signal, and latches the first switch device off when the abnormal state has continued over a predetermined time period.

14. An electronic circuit, comprising:
a switch driver circuit for driving a first switch device and a second switch device connected in series between two different potentials;
an oscillation circuit an oscillation frequency of which is set by an external device; and
an oscillation abnormality protection circuit that performs a predetermined oscillation abnormality protection operation when an abnormality of the oscillation frequency is detected,
wherein the switch driver circuit comprises:
a first monitor unit for monitoring a first control signal fed to the first switch device to generate a first monitor signal that indicates an on/off state of the first switch device;
a second monitor unit for monitoring a second control signal fed to the second switch device to generate a second monitor signal that indicates an on/off state of the second switch device;
a first control unit for generating the first control signal according to a predetermined drive signal and the second monitor signal; and
a second control unit for generating the second control signal according to the drive signal and the first monitor signal, wherein
the first control unit shifts a logic of the first control signal so as to latch the first switch device off, using, as a trigger, reception of an instruction to turn off the first switch device given according to the drive signal, and so as to release a latched-off state of the first switch device using, as a trigger, recognition of the second switch device having been turned off obtained according to the second monitor signal, and
the second control unit shifts a logic of the second control signal so as to latch off the second switch device using, as a trigger, reception of an instruction to turn off the second switch device given according to the drive signal, and so as to release latched-off state of the second switch device, using, as a trigger, recognition of the first switch device having been turned off obtained according to the first monitor signal, and
wherein switching frequencies of the first and second switch devices are set by an oscillation frequency of the oscillation circuit, the oscillation abnormality protection circuit stops switching driving of the first switch device when the oscillation frequency is out of a predetermined limit range, the oscillation circuit includes a resistor and a capacitor each as the external device, charges and discharges the capacitor by using a standard current generated by applying a predetermined voltage to a first terminal of the resistor, and outputs a terminal voltage of the capacitor as an oscillation signal, and the oscillation abnormality protection circuit monitors at least one of the standard current, a terminal voltage of the resistor, and the terminal voltage of the capacitor, and generates an oscillation abnormality protection signal according to a monitor result.

15. The electronic circuit of claim 14, further comprising:
a timer latch circuit that judges whether or not the overcurrent protection value is in an abnormal state according to the terminal abnormality protection signal, and latches the first switch device off when the abnormal state has continued over a predetermined time period.

* * * * *